United States Patent
Ko et al.

(10) Patent No.: US 10,859,640 B2
(45) Date of Patent: Dec. 8, 2020

(54) DEVICE AND METHOD OF DETECTING LEAKAGE CURRENT GENERATION CONDITION IN USB INTERFACE

(71) Applicant: Samsung Electronics Co., Ltd., Suwon-si (KR)

(72) Inventors: Eun-hye Ko, Seoul (KR); Je-kook Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 16/025,335

(22) Filed: Jul. 2, 2018

(65) Prior Publication Data

US 2019/0079130 A1    Mar. 14, 2019

(30) Foreign Application Priority Data

Sep. 12, 2017    (KR) ........................ 10-2017-0116660

(51) Int. Cl.
*G01R 31/69*    (2020.01)
*H01R 13/66*    (2006.01)
(Continued)

(52) U.S. Cl.
CPC .............. *G01R 31/69* (2020.01); *G01R 31/50* (2020.01); *G06F 13/4086* (2013.01); *G06F 13/4282* (2013.01); *H01R 13/6683* (2013.01); *G01R 27/14* (2013.01); *G06F 2213/0042* (2013.01); *H03K 17/687* (2013.01)

(58) Field of Classification Search
CPC ...... G01R 31/02; G01R 31/024; G01R 31/04; G01R 31/045; G01R 31/28; G01R 31/2812; G01R 31/025; G01R 17/105; G01R 27/26; G01R 27/14; G06F 13/40; G06F 13/4086; G06F 13/42; G06F 13/4282; G06F 2213/0042; H01R 13/66; H01R 13/6683; H03K 17/687

See application file for complete search history.

(56) References Cited

U.S. PATENT DOCUMENTS 9,077,195 B2    7/2015    Wada et al.
9,157,880 B2    10/2015    Stevens et al.
(Continued)

FOREIGN PATENT DOCUMENTS

JP    2015-226286 A    12/2015
KR    10-0468788 B1    1/2005
KR    10-2006-0080057 A    7/2006

*Primary Examiner* — Son T Le
(74) *Attorney, Agent, or Firm* — Harness, Dickey & Pierce, P.L.C.

(57) ABSTRACT

A device for detecting a leakage current generation condition in a universal serial bus (USB) interface including at least one pull-up circuit connected to the at least one power pin, and a port controller configured to detect at least one impedance between a ground pin and at least one power pin, detect a leakage current generation condition in the at least one power pin based on the at least one impedance detected, and activate a detection signal in response to the leakage current generation condition being detected, the port controller configured to detect the at least one impedance by controlling the at least one pull-up circuit to pull up the at least one power pin and detecting a voltage of the at least one power pin may be provided.

16 Claims, 20 Drawing Sheets

(51) Int. Cl.
  *G06F 13/42* (2006.01)
  *G06F 13/40* (2006.01)
  *G01R 31/50* (2020.01)
  *H03K 17/687* (2006.01)
  *G01R 27/14* (2006.01)

(56) References Cited

U.S. PATENT DOCUMENTS

| | | |
|---|---|---|
| 2008/0162955 A1* | 7/2008 | Shimizu .................. G06F 1/266 |
| | | 713/300 |
| 2013/0049680 A1 | 2/2013 | Katsumata |
| 2015/0229119 A1 | 8/2015 | Tao et al. |
| 2015/0234363 A1 | 8/2015 | Yoon et al. |
| 2016/0116509 A1 | 4/2016 | Kim |
| 2017/0024350 A1 | 1/2017 | Burgers |
| 2017/0033513 A1 | 2/2017 | Bae et al. |
| 2017/0110835 A1 | 4/2017 | Hasegawa et al. |
| 2018/0183340 A1* | 6/2018 | Waters .............. H02M 3/33507 |

\* cited by examiner

DEVICE AND METHOD OF DETECTING LEAKAGE CURRENT GENERATION CONDITION IN USB INTERFACE

CROSS-REFERENCE TO RELATED APPLICATION

This application claims priority under 35 U.S.C. § 119 to Korean Patent Application No. 10-2017-0116660, filed on Sep. 12, 2017, in the Korean Intellectual Property Office, the disclosure of which is incorporated herein in its entirety by reference.

BACKGROUND

The inventive concepts relate to universal serial bus (USB) interfaces, and more particularly, to devices and/or methods of detecting leakage current generation conditions in USB interfaces.

USB (or USB standard) is a standard for defining cables, connectors, and communication protocols for communication between devices, and USB interfaces are widely used in various applications. USB defines standards for power transmission as well as protocols for data transmission/reception. For example, USB Power Delivery (PD) specifies high power transmission (e.g., 20V-5 A transmission). Accordingly, when a node transmitting power is shorted to another node (e.g., when a conductive foreign material flows into a USB receptacle or when a short occurs in a USB cable), excessive power consumption may occur in a device functioning as a source supplying power through a USB interface, and may cause damage to the device by an overcurrent.

SUMMARY

The inventive concepts relate to universal serial bus (USB) interfaces, and provide devices and/or methods of detecting leakage current generation conditions in USB interfaces.

According to an example embodiment of the inventive concepts, a device for detecting a leakage current generation condition in a USB interface includes at least one pull-up circuit connected to at least one power pin, and a port controller configured to detect at least one impedance between a ground pin and the at least one power pin, detect a leakage current generation condition in the at least one power pin based on the at least one impedance detected, and activate a detection signal in response to the leakage current generation condition being detected, and the port controller configured to detect the at least one impedance by controlling the at least one pull-up circuit to pull up the at least one power pin and detecting a voltage of the at least one power pin.

According to an example embodiment of the inventive concepts, a device includes a USB receptacle including a ground pin and at least one power pin, at least one pull-up circuit connected to the at least one power pin, and a port controller configured to detect at least one impedance between the ground pin and the at least one power pin by controlling the at least one pull-up circuit to pull up the at least one power pin, and activate a detection signal in response to a leakage current generation condition being detected in the USB receptacle based on the at least one impedance detected.

According to an example embodiment of the inventive concepts, a method of detecting a leakage current generation condition in a USB interface includes detecting at least one impedance between a ground pin and at least one power pin, and activating a detection signal in response to a leakage current generation condition being detected in a USB receptacle based on the at least one impedance detected. The detecting at least one impedance includes pulling up the at least one power pin, detecting a voltage of the at least one power pin, and estimating the at least one impedance based on the voltage detected.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
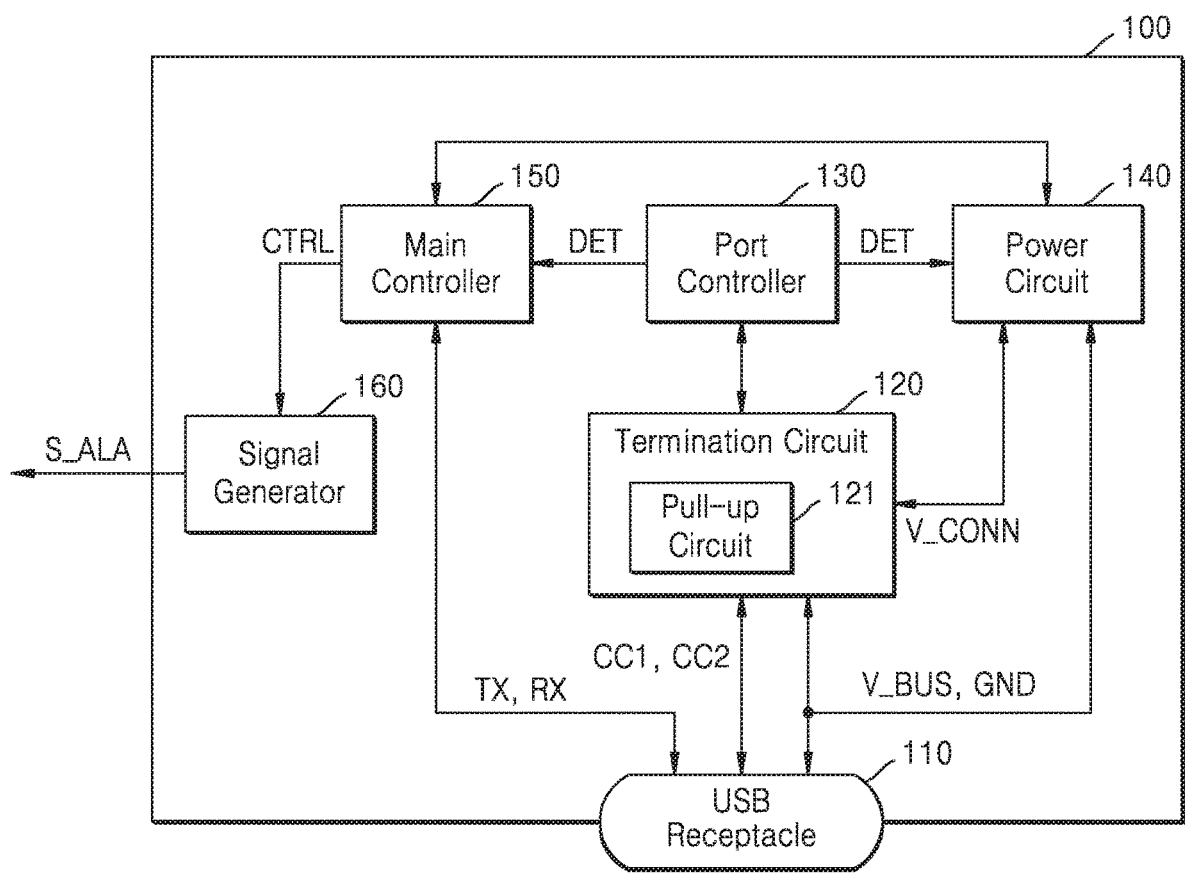
FIG. 1 is a block diagram illustrating a universal serial bus (USB) device according to an example embodiment.

FIG. 1 is a block diagram illustrating a universal serial bus (USB) device 100 according to an example embodiment. The USB device 100 may be any device capable of communicating with another device through a USB interface. For example, the USB device 100 may be a stationary device (e.g., a desktop computer or a server) or may be a mobile device (e.g., a laptop computer, a mobile phone, or a tablet personal computer (PC)). Further, the USB device 100 may be a component included in the above devices and configured to provide a USB interface. As illustrated in FIG. 1, the USB device 100 may include a USB receptacle 110, a termination circuit 120, a port controller 130, a power circuit 140, a main controller 150, and a signal generator 160.

For connection with a counterpart USB entity, the USB receptacle 110 may be connected, for example, to a USB cable or a USB plug that is a part of the USB entity. The USB receptacle 110 may include a plurality of exposed pins, and signals may be transmitted/received or power may be transmitted through the plurality of exposed pins. For example, as illustrated in FIG. 1, the USB receptacle 110 may include pins for transmitting a transmission signal TX, a received signal RX, channel configuration signals CC1 and CC2, a VBUS voltage V_BUS, and a ground voltage GND. The signals passing through the USB receptacle 110 illustrated in FIG. 1 are merely examples. In some example embodiments, additional signals such as sub-band use signals SBU1 and SBU2 may pass through the USB receptacle 110. In some example embodiments, the transmission signal TX and the received signal RX may be differential signals, and the USB receptacle 110 may include pairs of pins corresponding to the transmission signal TX and the received signal RX, respectively. In some example embodiments, the USB receptacle 110 may have a pin arrangement according to USB Type-C as described below with reference to FIG. 2. However, the present example embodiments are not limited thereto.

When a foreign material flows into the USB receptacle 110 while a USB plug is not connected to the USB receptacle 110, or when a short occurs in a USB cable connected to the USB receptacle 110, two or more pins among the pins included in the USB receptacle 110 may be electrically connected to each other. The pins improperly electrically connected to each other may generate a leakage current, thereby causing a failure in communication through a USB interface, and may even cause damage to the USB device 100 by an excessive leakage current. For example, when the USB device 100 is a portable device or a component included in a portable device, a conductive material such as water or metal may easily flow into the USB receptacle 110. As described below, some example embodiments of the inventive concepts may detect a leakage current generation condition by detecting a low impedance between the pins included in the USB receptacle 110. Thus, undesired power consumption may be reduced by interrupting a leakage current or issuing an alarm when a leakage current generation condition is detected, and/or the USB device 100 may be protected from the damage caused by an excessive leakage current. In some example embodiments, a low impedance between power pins (e.g., between a ground pin and a pin for transmitting power) among the pins of the USB receptacle 110 may be detected. Hereinafter, although it is described that a leakage current is caused by a state where a foreign material flows into the USB receptacle 110, it will be understood that various other factors may cause a leakage current.

The termination circuit 120 may be controlled by the port controller 130 and may provide a termination according to USB requirements to the USB receptacle 110. For example, the termination circuit 120 may transmit the channel configuration signals CC1 and CC2 to the USB receptacle 110 under the control of the port controller 130, or may transmit the channel configuration signals CC1 and CC2 received from the USB receptacle 110 to the port controller 130. Under the control of the port controller 130, the termination circuit 120 may provide a VCONN voltage V_CONN for providing power for an active cable (e.g., for controlling power supply from the power circuit 140 to the USB receptacle 110).

Figure 8A:
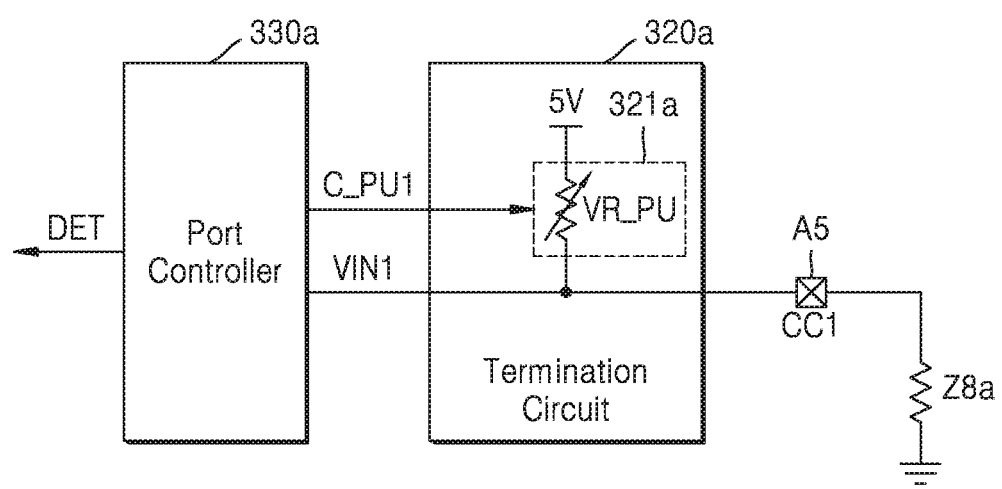
FIGS. 8A and 8B illustrate examples of equivalent circuits of a termination circuit of FIG. 7A according to some example embodiments.
Figure 8B:
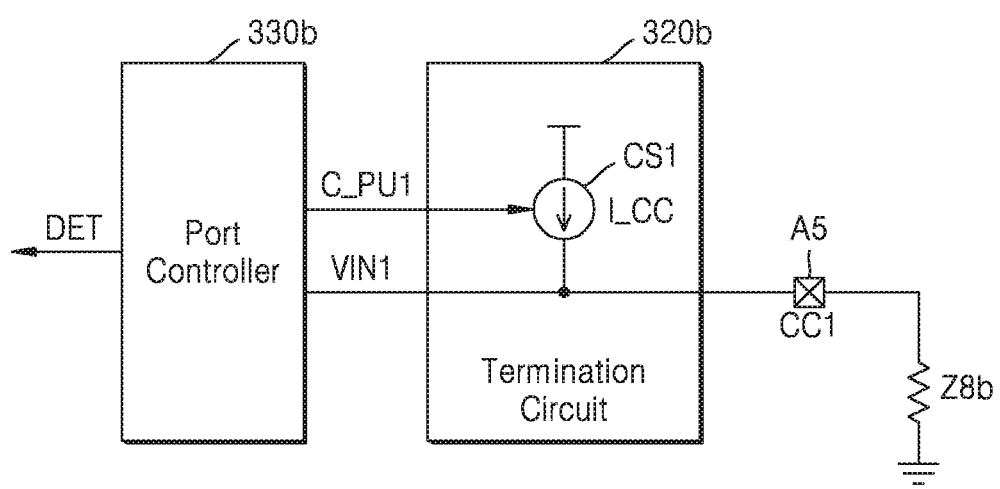

The termination circuit 120 may include a pull-up circuit 121. The pull-up circuit 121 may pull up at least one pin included in the USB receptacle 110 under the control of the port controller 130. For example, the pull-up circuit 121 may include a current source for supplying a current, as illustrated in FIG. 8A, and may include a pull-up resistor (e.g., a resistor having one end connected to a positive supply voltage), as illustrated in FIG. 8B. Under the control of the port controller 130, the pull-up circuit 121 may satisfy pull-up requirements according to USB requirements, and may be used to detect a low impedance between the pins included in the USB receptacle 110.

The port controller 130 may control the termination circuit 120 by communicating with the termination circuit 120, and may control a USB interface according to signals received through the termination circuit 120. For example, the port controller 130 may control the port power supplied to the outside through the USB receptacle 110 or received from the outside, and may process the channel configuration signals CC1 and CC2 according to the USB requirements. Further, the port controller 130 may control the pull-up circuit 121 of the termination circuit 120 to form a pull-up of the pins included in the USB receptacle 110 according to the USB requirements, may control the pull-up circuit 121 to detect a low impedance between pins, and may measure an impedance or detect a low impedance based on the signal received from the termination circuit 120. In some example embodiments, the port controller 130 may be a logic block implemented through logic synthesis, a processor, a software block included in a memory storing instructions to be performed by a processor, or a combination thereof.

When a low impedance is detected according to the signal received from the termination circuit 120, the port controller 130 may generate, for example, an activated detection signal DET indicating that the low impedance is detected. The detection signal DET may be provided to the main controller 150 and/or the power circuit 140, as illustrated in FIG. 1, and the main controller 150 and the power circuit 140 may perform operations according to the detection signal DET indicating the low impedance as described below. In some example embodiments, the termination circuit 120 and the port controller 130 may be included in one integrated circuit, and the integrated circuit including the termination circuit 120 and the port controller 130 may be referred to as a power delivery integrated circuit (PDIC).

The power circuit 140 may generate a VBUS voltage V_BUS and provide the same to the USB receptacle 110. In some example embodiments, when the USB device 100 supports a dual role port (DRP) capable of switching between a source (or host) and a sink (or device), the power circuit 140 may distribute the power supplied by the VBUS voltage V_BUS to other components of the USB device 100 by receiving the VBUS voltage V_BUS through the USB receptacle 110. Further, the power circuit 140 may generate a VCONN voltage V_CONN for providing power for an active cable and provide the same to the termination circuit 120. The VCONN voltage V_CONN may be provided to a CC1 pin (e.g., A5 in FIG. 2) or a CC2 pin (e.g., B5 in FIG. 2) of the USB receptacle 110 by the operation of the termination circuit 120 under the control of the port controller 130. Herein, a positive supply voltage for transmitting power, such as the VBUS voltage V_BUS and the VCONN voltage V_CONN, may be referred to as a power source voltage.

As illustrated in FIG. 1, the power circuit 140 may communicate with the main controller 150 and may receive the detection signal DET from the port controller 130. For example, the power circuit 140 may include at least one switch for interrupting the output of the power source voltage (e.g., the VCONN voltage V_CONN and/or the VBUS voltage V_BUS). The power circuit 140 may turn on or off the at least one switch according to the detection signal DET and/or under the control of the main controller 150. In some example embodiments, when a leakage current generation condition is detected in the USB receptacle 110, the power circuit 140 may mitigate or prevent an overcurrent from being supplied from the power source voltage by turning off at least one switch in response to the activated detection signal DET and/or under the control of the main controller 150.

The main controller 150 may generate a transmission signal TX or process a received signal RX and may communicate with the port controller 130. For example, the main controller 150 may include a USB port manager (not shown), and the USB port manager may operate a port policy and a USB PD (Power Delivery) protocol by communicating with the port controller 130. A state machine of the USB interface may be implemented collectively by the main controller 150 and the port controller 130.

As illustrated in FIG. 1, the main controller 150 may receive the detection signal DET from the port controller 130 and perform operation(s) according to the detection signal DET. In some example embodiments, when the activated detection signal DET indicating the detection of a leakage current generation condition in the USB receptacle 110 is received from the port controller 130, the main controller 150 may generate an alarm control signal CTRL and provide the same to the signal generator 160 such that the signal generator 160 generates an alarm signal S_ALA. In some example embodiments, the port controller 130 may interrupt the power source voltage from being supplied to the USB receptacle 110 by controlling the power circuit 140 in response to the activated detection signal DET.

The signal generator 160 may generate an alarm signal S_ALA recognizable by the user of the USB device 100 according to the alarm control signal CTRL provided from the main controller 150. In some example embodiments, the alarm signal S_ALA may be a sound, and the signal generator 160 may include, for example, a speaker and/or a buzzer for outputting a sound. In some example embodiments, the alarm signal S_ALA may be a visible signal, and the signal generator 160 may include a display component such as a liquid crystal display (LCD) and/or a lamp such as a light-emitting diode (LED). When the signal generator 160 includes a display component, an alarm window may be displayed on the display component according to the alarm control signal CTRL. In some example embodiments, the alarm signal S_ALA may be a vibration of the USB device 100, and the signal generator 160 may include a component (e.g., a motor) for generating a vibration.

Figure 2:
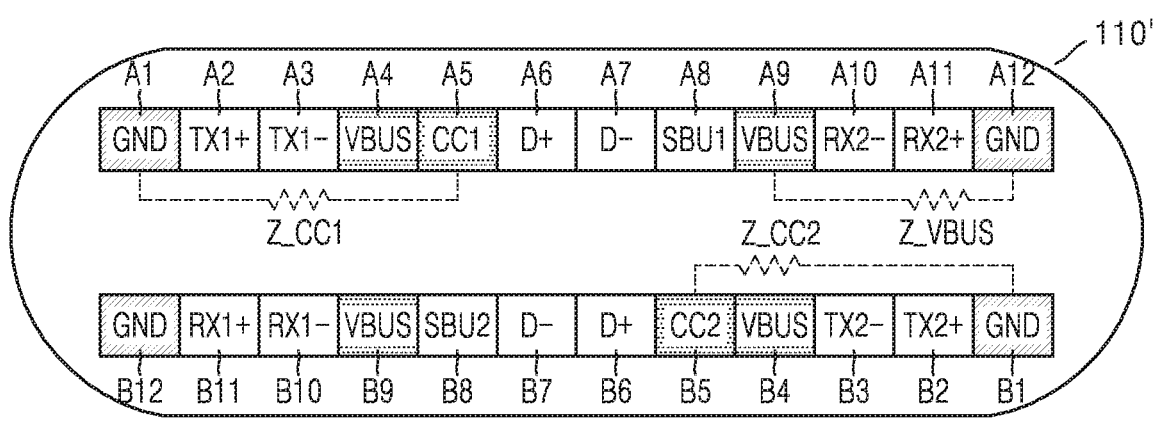
FIG. 2 is a block diagram illustrating an example of a USB receptacle of FIG. 1 according to an example embodiment.

FIG. 2 is a block diagram illustrating an example of a USB receptacle of FIG. 1 according to an example embodiment. In detail, FIG. 2 illustrates a USB receptacle 110' according to USB Type-C. Hereinafter, FIG. 2 will be described with reference to FIG. 1.

Referring to FIG. 2, the USB receptacle 110' may have a symmetrical pin arrangement. Due to the symmetrical pin arrangement defined in USB Type-C, USB receptacles and USB plugs may be normally coupled in any direction. The USB receptacle 110' may be provided as a data bus and may include a TX1+ pin A2, a TX1- pin A3, an RX1+ pin B11, an RX1- pin B10, a TX2+ pin B2, a TX2- pin B3, an RX2+ pin A11, and an RX2- pin A10. The USB receptacle 110' may include VBUS pins A4, A9, B4, and B9 as a power bus, and a CC1 pin A5 or a CC2 pin B5 may function as a power pin for transmitting a VCONN voltage V_CONN according to the coupling direction with respect to a USB plug. Also, the USB receptacle 110' may include two sideband use (SBU) pins A8 and B8 and may include two channel configuration (CC) pins A5 and B5. The CC1 pin A5 and the CC2 pin B5 may be collectively referred to as a CC pin. Unlike the USB receptacle 110', in some example embodiments, the USB plug coupled with the USB receptacle 110' may include one channel configuration pin CC and a dedicated VCONN pin. Lastly, the USB receptacle 110' may include four ground pins A1, A12, B1, and B12 disposed at the edges thereof. The four VBUS pins A4, A9, B4, and B9 may be electrically interconnected (e.g., have equal potential) in the USB receptacle 110' or at the termination circuit 120 of FIG. 1, and the four ground pins A1, A12, B1, and B12 may also be electrically interconnected in the USB receptacle 110' or at the termination circuit 120 of FIG. 1. As illustrated in FIG. 2, the USB Type-C may include a plurality of power pins, and thus may be vulnerable to a leakage current caused by the inflow of a conductive foreign material.

As described above with reference to FIG. 1, when a foreign material flows into the USB receptacle 110' or a short occurs in a USB cable connected to the USB receptacle 110', a leakage current may be generated. For example, when an electrical path is formed between the power pins (i.e., the VBUS pins A4, A9, B4, and B9), the ground pins A1, A12, B1, and B12, and the CC1 pin A5 or the CC2 pin B5 for supplying power, a leakage current may be significantly increased. Thus, as illustrated in FIG. 2, by detecting impedances Z_CC1, Z_CC2, and Z_VBUS formed between the power pins A5, A9, and B5 and the ground pins, a leakage current generation conditions (e.g., the generation of a leakage current) may be predicted. That is, a first CC impedance Z_CC1 between the CC1 pin A5 and the ground pin A1, a second CC impedance Z_CC2 between the CC2 pin B5 and the ground pin B1, and a VBUS impedance Z_VBUS between the VBUS pin A9 and the ground pin A12 may be detected. Because the ground pins A1, A12, B1, and B12 are electrically interconnected, the first CC impedance Z_CC1 may represent the impedance between the CC1 pin A5 and the ground node and the second CC impedance Z_CC2 may represent the impedance between the CC2 pin B5 and the ground node. Because the VBUS pins A4, A9, B4, and B9 are electrically interconnected, the VBUS impedance Z_VBUS may represent the impedance between the V_BUS node and the ground node. Accordingly, in the following drawings, the detected impedances are illustrated as the impedances between the pins illustrated in FIG. 2, but example embodiments are not limited thereto.

Figure 3A:
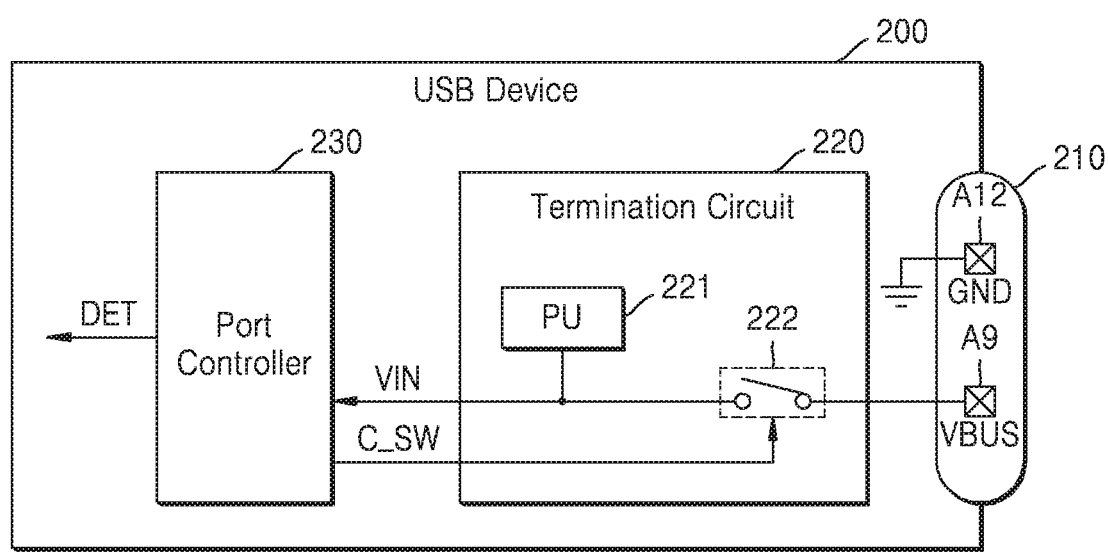
FIGS. 3A and 3B are block diagrams illustrating possible states of a USB receptacle according to some example embodiments.
Figure 3B:
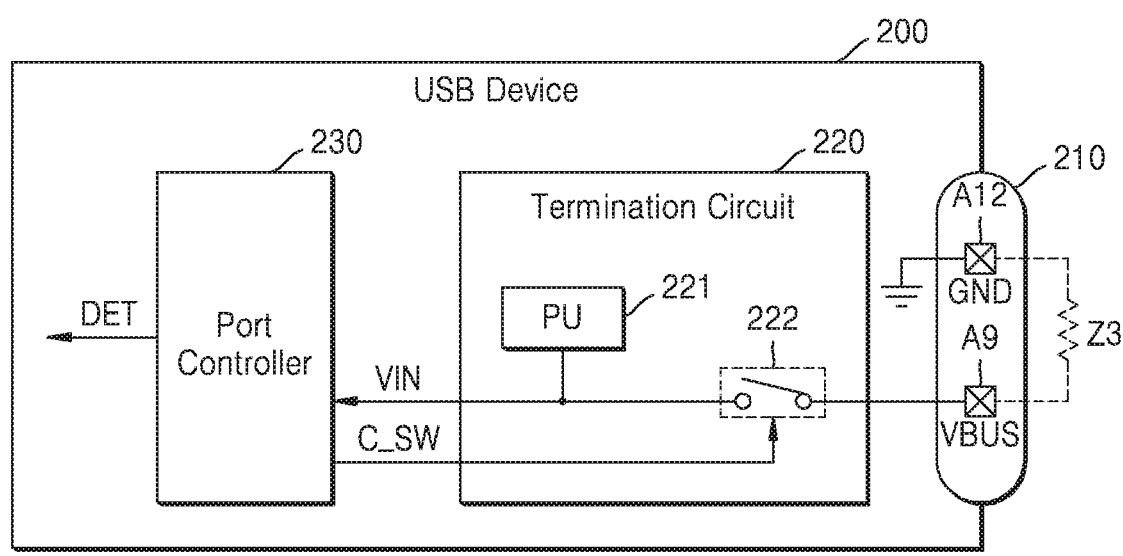

FIGS. 3A and 3B are block diagrams illustrating possible states of a USB receptacle according to some example embodiments. In detail, FIG. 3A illustrates an open state (e.g., a state where nothing is inserted into a USB receptacle 210), and FIG. 3B illustrates a state where a conductive foreign material flows into the USB receptacle 210. Hereinafter, redundant descriptions among the descriptions about FIGS. 3A and 3B will be omitted for conciseness.

As illustrated in FIGS. 3A and 3B, a USB device 200 may include a USB receptacle 210, a termination circuit 220, and a port controller 230. The USB receptacle 210 may include a VBUS pin A9 and a ground pin A12, and the termination circuit 220 may be electrically connected to the VBUS pin A9. The port controller 230 may receive an input voltage VIN from the termination circuit 220 and may provide a switch control signal C_SW to the termination circuit 220.

Referring to FIG. 3A, the termination circuit 220 may include a pull-up circuit 221 and a switch 222. The switch 222 may have one end connected to the VBUS pin A9 of the USB receptacle 210 and one end connected to the pull-up circuit 221, and may be turned on/off by the switch control signal C_SW received from the port controller 230. Accordingly, when the switch 222 is turned on, the pull-up circuit 221 and the VBUS pin A9 may be electrically connected to each other, and when the switch 222 is turned off, the pull-up circuit 221 and the VBUS pin A9 may be electrically disconnected from each other. The switch 222 may have any structure for electrically connecting or disconnecting both ends according to the switch control signal C_SW. In some example embodiments, the switch 222 may include an NMOS transistor or a PMOS transistor having a gate to which the switch control signal C_SW is applied. In some example embodiments, because a relatively high voltage (e.g., 20 V) may be applied to the VBUS according to the USB PD, the switch 222 may include a power transistor having a relatively high operation voltage. Herein, the switch 222 may be referred to as a VBUS detection switch.

The pull-up circuit 221 may pull up an input voltage (VIN) node. For example, the pull-up circuit 221 may include a pull-up resistor as described below with reference to FIG. 4A, and may include a current source as described below with reference to FIG. 4B. Accordingly, as illustrated in FIG. 3A, when the switch 222 is turned off, the input voltage VIN may be maintained uniform by the pull-up circuit 221, and when the switch 222 is turned on, the input voltage VIN may depend on the state of the VBUS pin A9.

The port controller 230 may turn on the switch 222 through the switch control signal C_SW to measure the impedance (or VBUS impedance) between the VBUS pin A9 and the ground pin A12. For example, the port controller 230 may turn on the switch control signal C_SW for a desired (or alternatively, predetermined) period, and may measure the impedance between the VBUS pin A9 and the ground pin A12. In FIG. 3A, when the switch 222 is turned on, the port controller 230 may receive the input voltage VIN having a level caused by the pull-up circuit 221. When the VBUS pin A9 and the ground pin A12 are mutually insulated, the port controller 230 may receive substantially the same level of the input voltage VIN regardless of whether the switch 222 is turned on or off. In some example embodiments, the port controller 230 may include an analog-to-digital converter (ADC) that receives an input voltage VIN (or a voltage obtained by amplifying the input voltage VIN), and may detect the level of the input voltage VIN based on the digital output of the analog-to-digital converter. In some example embodiments, the port controller 230 may include a circuit for providing different outputs according to the levels of the input voltage VIN with respect to at least one desired (or alternatively, predetermined) reference voltage (e.g., V_REF in FIG. 5), and may detect the level of the input voltage VIN based on the output of at least one comparator.

Referring to FIG. 3B, a foreign material may flow into the USB receptacle 210, and thus an impedance Z3 may be formed between the VBUS pin A9 and the ground pin A12. Accordingly, as illustrated in FIG. 3B, when the switch 222 is turned off according to the switch control signal C_SW, the input voltage VIN may have a level caused by the pull-up circuit 221, and when the switch 222 is turned on according to the switch control signal C_SW, the input voltage VIN may have a level dropped by the impedance Z3.

The pull-up circuit 221 may have a driving strength determined based on the range of the impedance Z3 of the foreign material flowing into the USB receptacle 210. The input voltage VIN may have different levels when the switch is turned on in each of FIGS. 3A and 3B, and the driving strength of the pull-up circuit 221 may be determined such that the port controller 230 distinguishes the state of FIG. 3A and the state of FIG. 3B through the level change of the input voltage VIN due to the impedance Z3.

In some example embodiments, the driving strength of the pull-up circuit 221 may be determined based on the resolution of the port controller 230 with respect to the input voltage VIN. As described above, the port controller 230 may include an analog-to-digital converter or a comparator to detect the level change of the input voltage VIN, and the driving strength of the pull-up circuit 221 may be determined according to the resolution of the analog-to-digital converter or the comparator such that the analog-to-digital converter or the comparator may output a suitable signal according to the range of the impedance Z3 of a foreign material. The driving strength of the pull-up circuit 221 may increase as the resistance of a pull-up resistor decreases, and may increase as the current level of a current source increases.

Figure 4A:
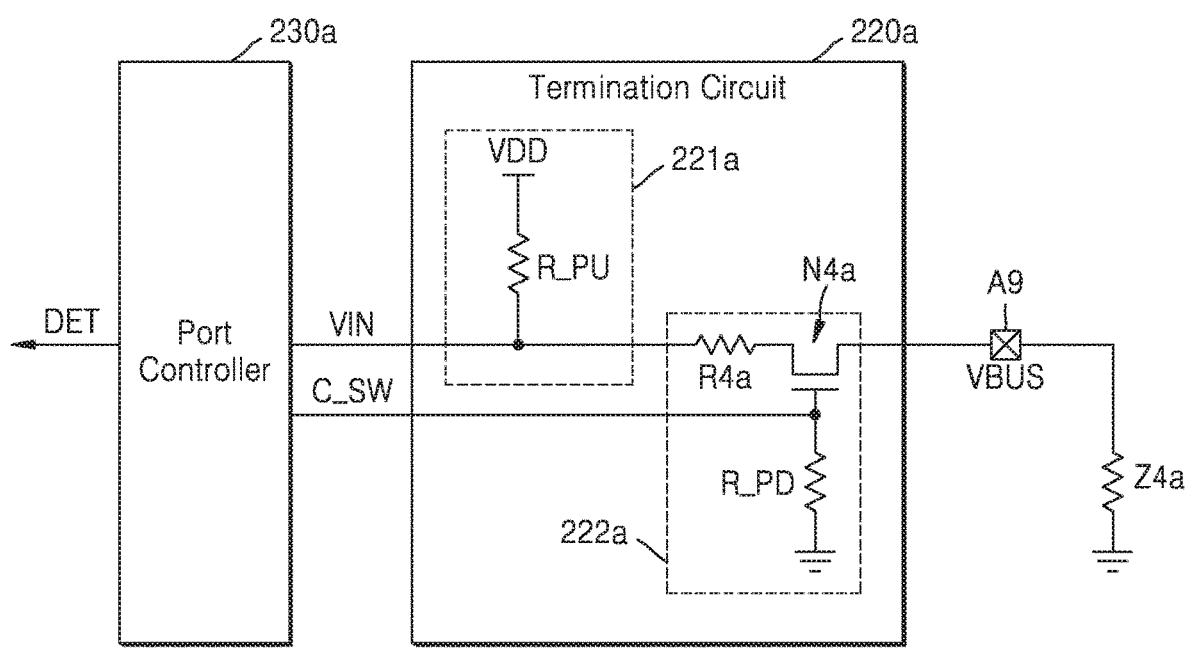
FIGS. 4A and 4B illustrate examples of equivalent circuits of a termination circuit of FIG. 3A according to some example embodiments.
Figure 4B:
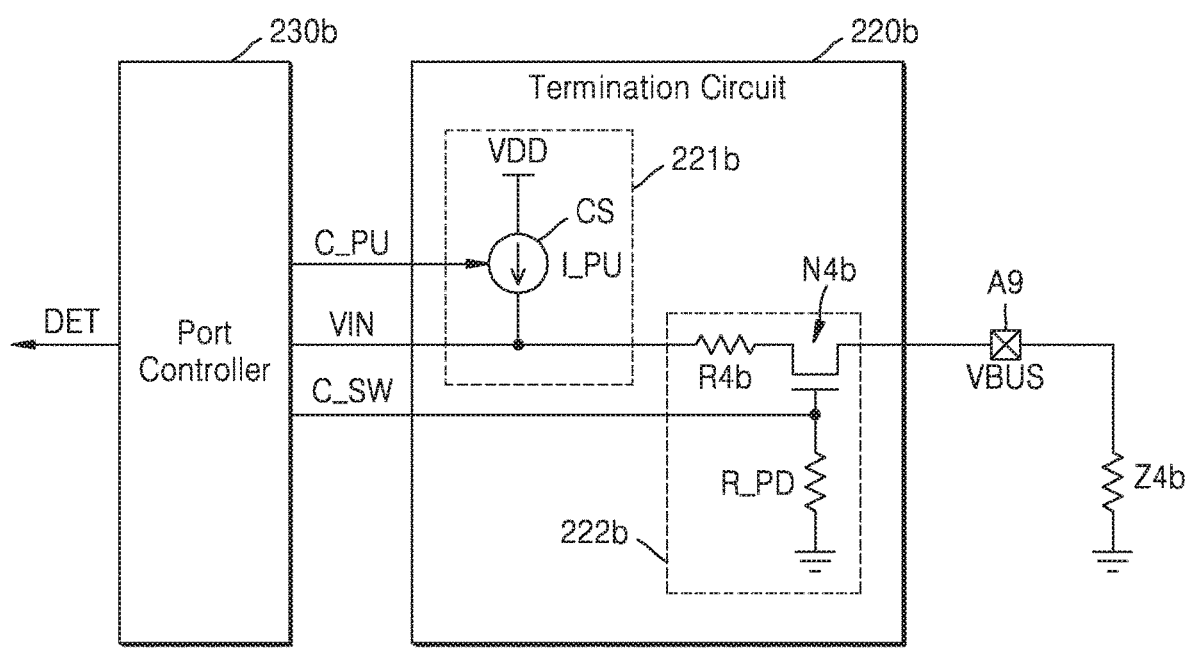

FIGS. 4A and 4B illustrate examples of equivalent circuits of the termination circuit 220 of FIG. 3A according to some example embodiments. In detail, FIG. 4A illustrates a termination circuit 220a including a pull-up resistor R_PU, and FIG. 4B illustrates a termination circuit 220b including a current source CS. As described above with reference to FIGS. 3A and 3B, the termination circuits 220a and 220b and port controllers 230a and 230b of FIGS. 4A and 4B may detect impedances Z4a and Z4b between the VBUS pin A9 and the ground potential. Hereinafter, FIGS. 4A and 4B will be described with reference to FIG. 3A, and redundant descriptions among the descriptions about FIGS. 4A and 4B will be omitted for conciseness.

Referring to FIG. 4A, the termination circuit 220a may be connected to the VBUS pin A9, provide the input voltage VIN to the port controller 230a, and receive the switch control signal C_SW from the port controller 230a. As in the USB device 200 of FIG. 3A, the termination circuit 220a may include a pull-up circuit 221a and a switch 222a.

The pull-up circuit 221a may include a pull-up resistor R_PU. The pull-up resistor R_PU may have one end connected to a positive supply voltage VDD and may pull up an input voltage (VIN) node. The switch 222a may include a transistor N4a, a resistor R4a connected to the transistor N4a and the pull-up circuit 221a, and a pull-down resistor R_PD disposed between the ground potential and the gate of the transistor N4a. In FIG. 4A, the transistor N4a may be an NMOS transistor. The NMOS transistor may have a source and a drain connected to the VBUS pin A9 and the resistor R4a respectively and a gate to which the switch control signal C_SW is applied. Accordingly, when the switch control signal C_SW has a high voltage (e.g., an approximately positive supply voltage), the transistor N4a may be turned on and a charge movement path may be formed between the pull-up circuit 221a and the VBUS pin A9. On the other hand, when the switch control signal C_SW has a low voltage (e.g., an approximately negative supply voltage or a ground voltage), the transistor N4a may be turned off and the charge movement path between the pull-up circuit 221a and the VBUS pin A9 may be interrupted. As illustrated in FIG. 4A, when the pull-down resistor R_PD is connected to the transistor N4a, the transistor N4a may be turned off even when the switch control signal C_SW is floated. In some example embodiments, when the switch control signal C_SW may be controlled by the port controller 230a to have a low voltage (e.g., a ground voltage), and the pull-down resistor R_PD may be omitted.

When the transistor N4a is turned off by the low-voltage switch control signal C_SW, the input voltage VIN may match the positive supply voltage VDD. In order to measure the impedance between the VBUS pin A9 and the ground potential, when the transistor N4a is turned on by the high-voltage switch control signal C_SW, the input voltage VIN may have a level dividing the positive supply voltage VDD by the pull-up resistor R_PU, the resistor R4a, and the impedance Z4a. When a foreign material does not flow into the USB receptacle and thus the impedance Z4a is high, the input voltage VIN may have approximately the same level as the positive supply voltage VDD. When a conductive foreign material flows into the USB receptacle and thus the impedance Z4a is low, the input voltage VIN may have a lower level than the positive supply voltage VDD. Accordingly, when the input voltage VIN drops from the positive supply voltage VDD to a certain (or alternatively, predetermined) level or below, the port controller 230a may generate a detection signal (e.g., DET in FIG. 1) indicating that there exist a foreign material. The pull-up resistor R_PU, the resistor R4a, and the pull-down resistor R_PD may have resistances suitable for detecting the impedance Z4a based on the range of the impedance Z4a and the resolution of the port controller 230b with respect to the input voltage VIN. In some example embodiments, because a relatively high positive voltage (e.g., 20 V) may be applied to the VBUS pin A9, the resistor R4a may have a resistance (e.g., several tens to several hundreds of kΩ) suitable for protecting the circuit based on the positive supply voltage VDD and the operation voltage of the port controller 230a.

Referring to FIG. 4B, the termination circuit 220b may be connected to the VBUS pin A9, provide the input voltage VIN to the port controller 230b, and receive the switch control signal C_SW from the port controller 230b. Further, as illustrated in FIG. 4B, the termination circuit 220b may receive a pull-up control signal C_PU. Further, the termination circuit 220b may include a pull-up circuit 221b and a switch 222b.

The pull-up circuit 221b may include a current source CS that generates a pull-up current I_PU. The current source CS may pull up an input voltage (VIN) node by providing a pull-up current I_PU. The current source CS may receive the pull-up control signal C_PU from the port controller 230b and may change the magnitude of the pull-up current I_PU according to the pull-up control signal C_PU. For example, the port controller 230b may improve the accuracy of the detection of the impedance Z4b by detecting the impedance Z4b by using the pull-up currents I_PU of different levels. The port controller 230b may reduce the power consumed to detect the impedance Z4b by omitting the generation of a relatively large pull-up current I_PU (e.g., a relatively large driving strength) when the impedance Z4b is high in a relatively small pull-up current I_PU (e.g., a relatively small driving strength). The pull-up control signal C_PU may disable the current source CS, and the disabled current source CS may not generate a pull-up current I_PU, and thus the power consumption of the termination circuit 220b may be reduced. Although not illustrated in FIG. 4A, in some example embodiments, the pull-up resistor R_PU of FIG. 4A may be a variable resistor whose resistance is changed under the control of the port controller 230a, and the port controller 230a may detect the impedance Z4a while adjusting from a relatively large resistance (e.g., a relatively small driving strength) to a relatively small resistance (e.g., a relatively large driving strength).

In some example embodiments, the current source CS may be a current source used for pull-up according to the USB requirements in the USB interface. For example, as described below with reference to FIG. 7A, the USB requirements may specify supplying 80 μA, 180 μA, and 330 μA to the CC1 pin A5 and the CC2 pin B5 of FIG. 2, and for this purpose, the termination circuit 220b may include at least one current source that supplies a current to the CC1 pin A5 and the CC2 pin B5. As such, the current supplied to the CC1 pin A5 and the CC2 pin B5 may be referred to as a source CC termination (Rp) current. A current source supplying a current to the CC1 pin A5 and the CC2 pin B5 may be commonly used to detect the impedance Z4b between the VBUS pin A9 and the ground potential, and the impedance Z4b may be detected by at least one pull-up current I_PU among 80 μA, 180 μA, and 330 μA.

The switch 222b may include a transistor N4b, a pull-down resistor R_PD, and a resistor R4b connected to the transistor N4b and the pull-up circuit 221b Like the switch 222a of FIG. 4A, the switch 222b of FIG. 4B may also form or interrupt a charge movement path between the pull-up circuit 221b and the VBUS pin A9 according to the switch control signal C_SW from the port controller 230b.

Figure 5:
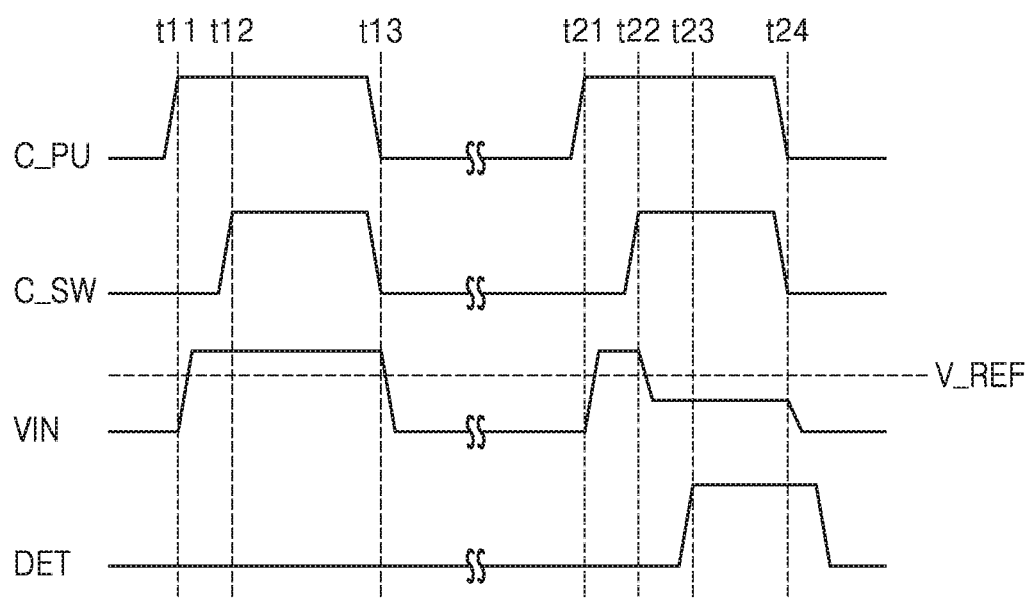
FIG. 5 is a timing diagram illustrating operations of a termination circuit and a port controller of FIG. 4B according to an example embodiment.

FIG. 5 is a timing diagram illustrating operations of the termination circuit 220b and the port controller 230b of FIG. 4B according to an example embodiment. In detail, FIG. 5 illustrates a pull-up control signal C_PU for enabling/disabling the current source CS, a switch control signal C_SW for turning on/off the switch 222b, an input voltage VIN provided from the termination circuit 220b, and a detection signal DET generated by the port controller 230b, with the passage of time. In FIG. 5, the pull-up control signal C_PU, the switch control signal C_SW, and the detection signal DET are active high signals, wherein a high level may indicate an active state and a low level may indicate an inactive state. In FIG. 5, it is assumed that a USB receptacle is open at times t11 to t13 and a conductive foreign material is introduced at times t21 to t24. Hereinafter, FIG. 5 will be described with reference to FIG. 4B.

At time t11, for the detection of the impedance Z4b, the port controller 230b may activate the pull-up control signal C_PU. Because the switch 222b is in an off state according to the deactivated switch control signal C_SW, the input voltage VIN may be risen by the current source CS, as illustrated in FIG. 5. At time t12, the port controller 230b may activate the switch control signal C_SW. Because the USB receptacle is in an open state, the impedance Z4b between the VBUS pin A9 and the ground potential may be high (e.g., infinite) and thus the level of the input voltage VIN may be substantially maintained. The port controller 230b may measure the input voltage VIN after time t12 and may recognize that the USB receptacle is in an open state due to the input voltage VIN being higher than the reference voltage V_REF. As a result, the detection signal DET may be maintained in an inactive state. At time t13, the port controller 230b may deactivate the pull-up control signal C_PU and the switch control signal C_SW and complete the detection of the impedance Z4b.

After a certain period has elapsed from time t11, at time t21, the port controller 230b may again activate the pull-up control signal C_PU in order to detect the impedance Z4b. Because the switch 222b is in an off state according to the deactivated switch control signal C_SW, the input voltage VIN may be risen by the current source CS. At time t22, the port controller 230b may activate the switch control signal C_SW, and the impedance Z4b between the VBUS pin A9 and the ground potential may be low due to the conductive foreign material introduced into the USB receptacle, and thus the input voltage VIN may drop as illustrated in FIG. 5. The port controller 230b may measure the input voltage VIN after time t22 and may recognize that a foreign material is introduced into the USB receptacle due to the input voltage VIN being lower than the reference voltage V_REF. At time t23, the port controller 230b may activate the detection signal DET due to the low level of the input voltage VIN. As described above with reference to FIG. 5, the activated detection signal DET may be transmitted to the main controller 150 and/or the power circuit 140. At time t24, the port controller 230b may deactivate the pull-up control signal C_PU and the switch control signal C_SW and complete the detection of the impedance Z4b.

Figure 6:
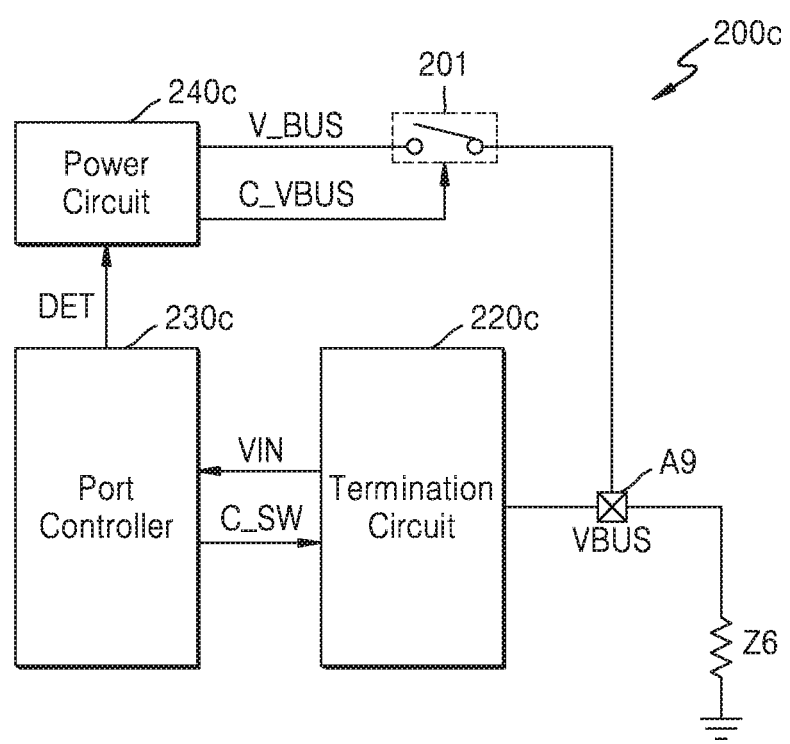
FIG. 6 is a block diagram illustrating a USB device according to an example embodiment.

FIG. 6 is a block diagram illustrating a USB device 200c according to an example embodiment. As illustrated in FIG. 6, the USB device 200c may include a termination circuit 220c, a port controller 230c, a power circuit 240c, and a VBUS switch 201. As described below, the activated detection signal DET output from the port controller 230c may block the VBUS voltage V_BUS from being output through the VBUS pin A9.

The termination circuit 220c may be connected to the VBUS pin A9 and may provide the input voltage VIN to the port controller 230c according to the switch control signal C_SW of the port controller 230c. The port controller 230c may detect the impedance Z6 between the VBUS pin A9 and the ground potential based on the input voltage VIN, and when the detected impedance Z6 is lower than a certain (or alternatively, predetermined) reference value, the port controller 230c may output an activated detection signal DET indicating that a foreign material is introduced into the USB receptacle.

The power circuit 240c may generate the VBUS voltage V_BUS and may receive the detection signal DET. Further, the power circuit 240c may generate a VBUS control signal C_VBUS for controlling the VBUS switch 201. The VBUS switch 201 may transmit or interrupt transmission of the VBUS voltage V_BUS generated by the power circuit 240c to the VBUS pin A9 according to the VBUS control signal C_VBUS. The power circuit 240c may turn off the VBUS switch 201 through the VBUS control signal C_VBUS in response to the activated detection signal DET, thereby interrupting, mitigating or preventing a leakage current between the ground potential and the VBUS voltage V_BUS due to the low impedance Z6. The VBUS switch 201 may have any structure for electrically connecting or disconnecting both ends according to the VBUS control signal C_VBUS and may include, for example, an NMOS transistor or a PMOS transistor having a gate to which the VBUS control signal C_VBUS is applied.

In some example embodiments, the VBUS switch 201 may be controlled by a control signal output from the port controller 230c. In some example embodiments, the VBUS switch 201 may be controlled by a control signal output from the main controller 150 of FIG. 1. In some example embodiments, instead of receiving the detection signal DET from the port controller 230c, the power circuit 240c may generate the VBUS control signal C_VBUS according to the signal received from the main controller 150 of FIG. 1, which is configured to receive the detection signal DET. Further, the VBUS switch 201 may be included in the power circuit 240c.

Figure 7A:
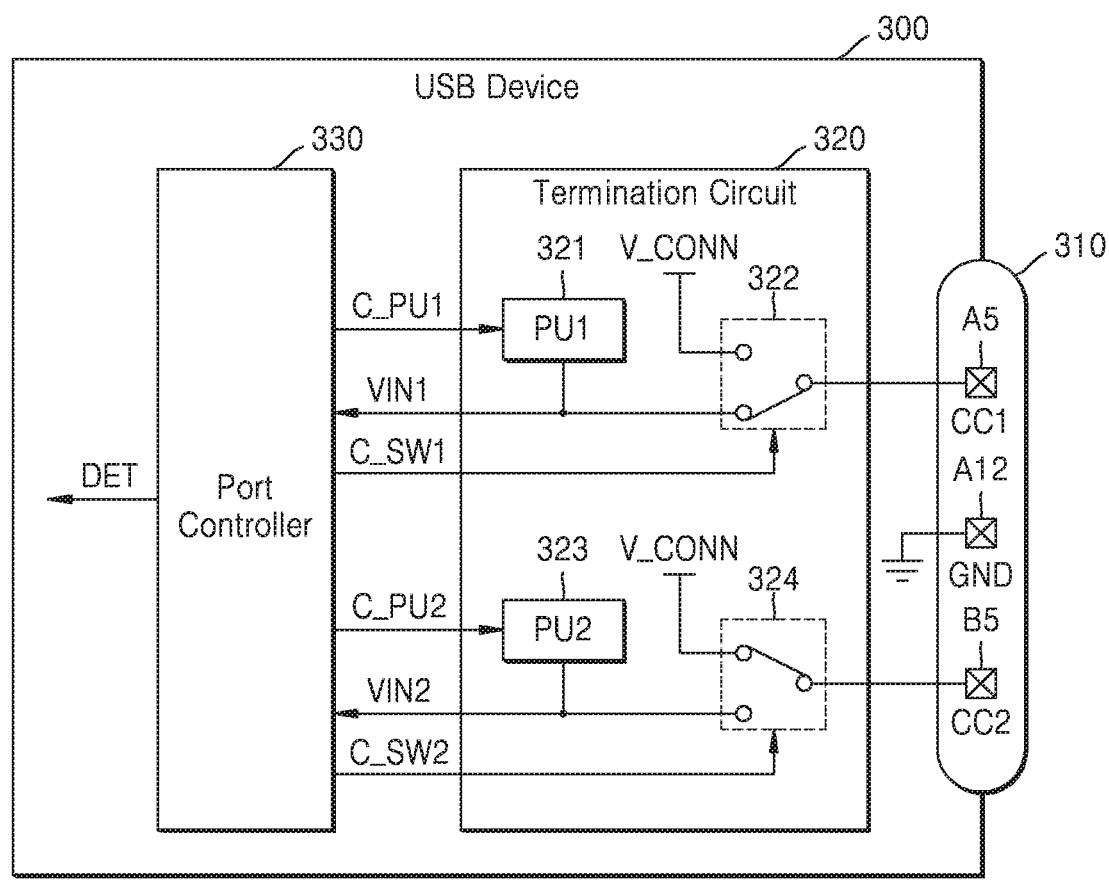
FIGS. 7A to 7C are block diagrams illustrating possible states of a USB receptacle according to some example embodiments.
Figure 7B:
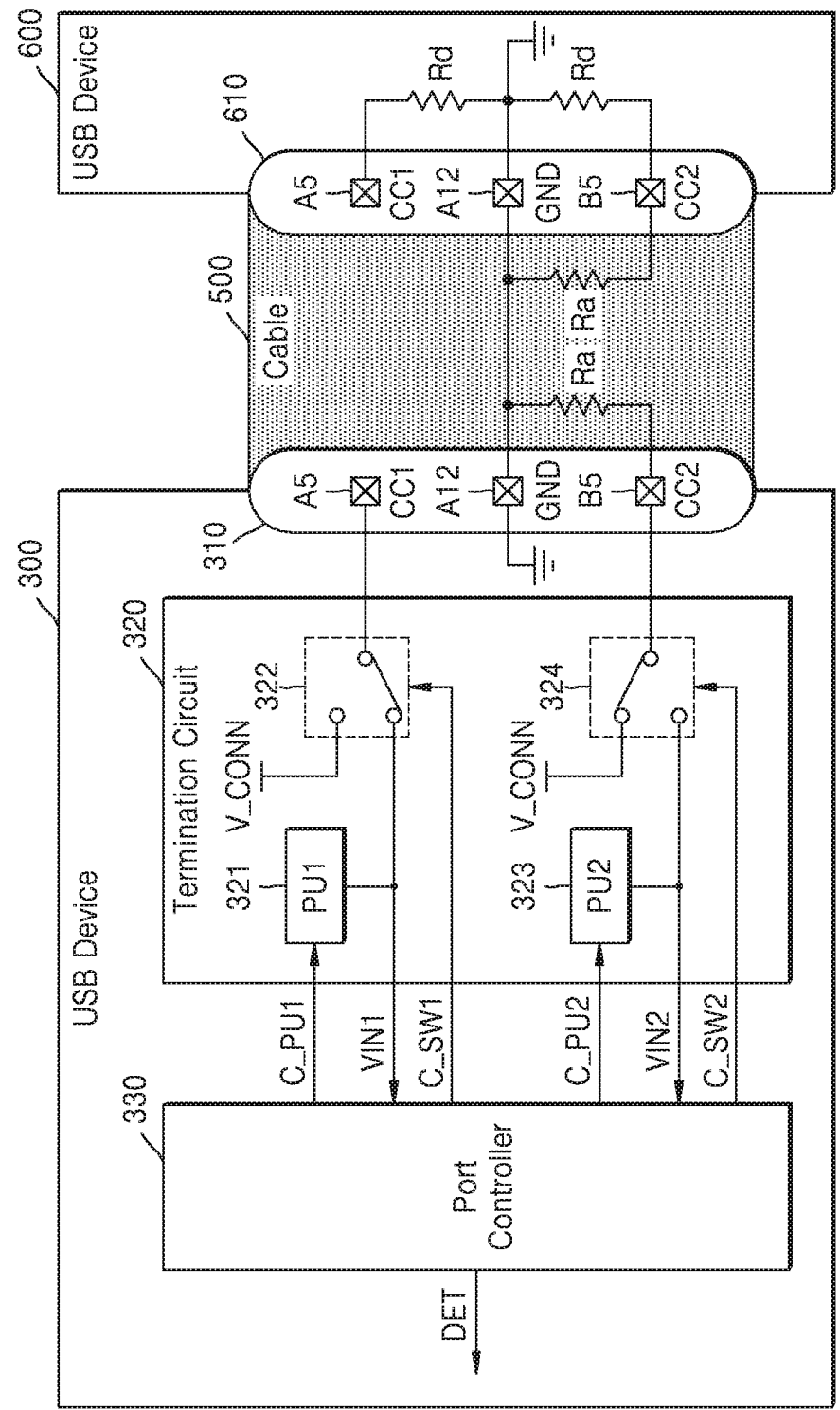
Figure 7C:
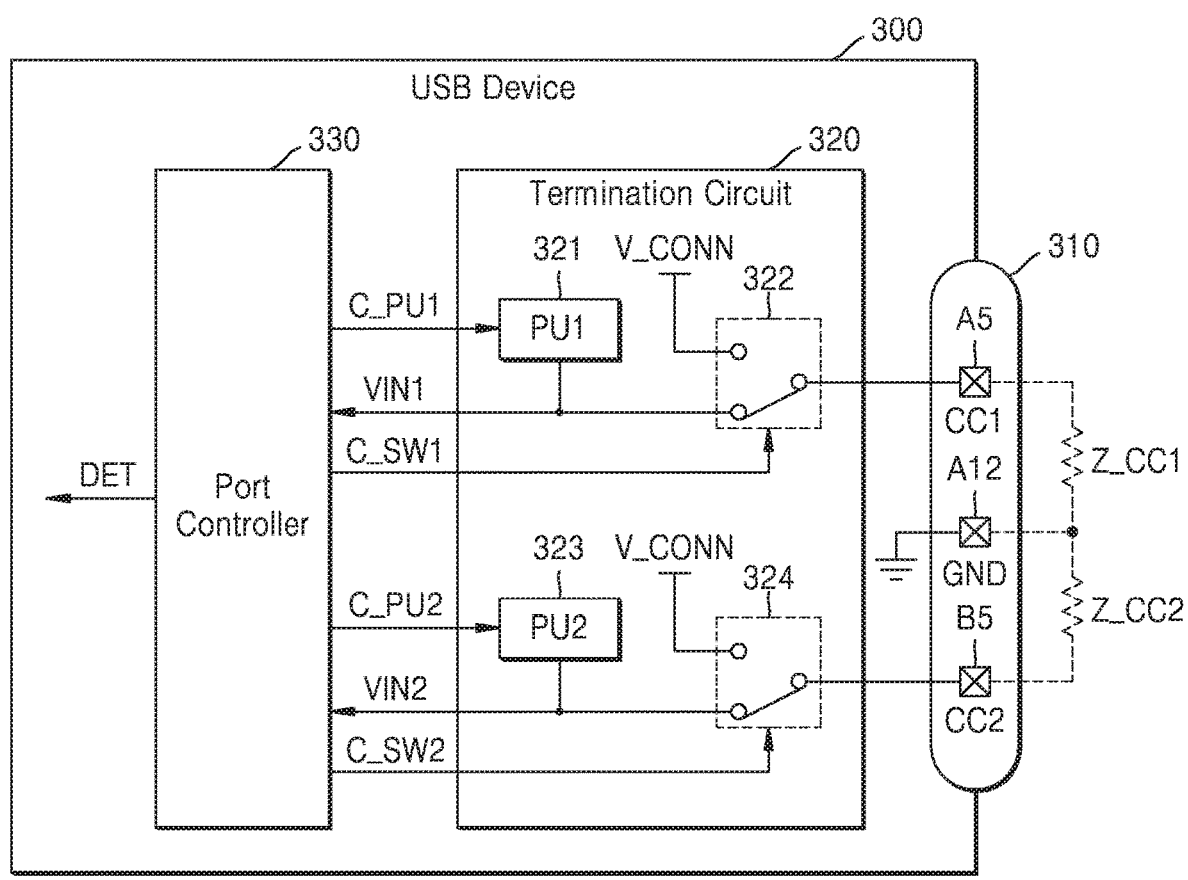

FIGS. 7A to 7C are block diagrams illustrating possible states of a USB receptacle according to some example embodiments. In detail, FIG. 7A illustrates a state where a USB receptacle 310 is opened, FIG. 7B illustrates a state where the USB receptacle 310 is connected to a USB receptacle 610 of a counterpart USB device 600 through a cable 500, and FIG. 7C illustrates a state where a conductive foreign material is introduced into the USB receptacle 310. Hereinafter, although the CC1 pin A5 is mainly described with reference to FIGS. 7A to 7C, it will be understood that the descriptions of the CC1 pin A5 may also apply to the CC2 pin B5.

As illustrated in FIGS. 7A to 7C, a USB device 300 may include a USB receptacle 310, a termination circuit 320, and a port controller 330. The USB receptacle 310 may include a CC1 pin A5, a CC2 pin B5, and a ground pin A12, and the termination circuit 320 may be electrically connected to the CC1 pin A5 and the CC2 pin B5. The port controller 330 may receive first and second input voltages VIN1 and VIN2 from the termination circuit 320 and may provide first and second pull-up control signals C_PU1 and C_PU2 and first and second switch control signals C_SW1 and C_SW2 to the termination circuit 320.

Referring to FIG. 7A, the termination circuit 320 may include first and second pull-up circuits 321 and 323 and first and second switches 322 and 324. The first switch 322 may connect the CC1 pin A5 to the first pull-up circuit 321 or to the VCONN voltage V_CONN according to the first switch control signal C_SW1.

The first pull-up circuit 321 may provide a termination of the CC1 pin A5 according to the USB requirements by pulling up a first input voltage (VIN1) node. For example, the first pull-up circuit 321 may include a current source providing 80 μA, 180 μA, or 330 μA at 1.7 V to 5.5 V to provide a source CC termination Rp according to the USB requirements, may include a pull-up resistor having one end connected to a positive supply voltage of 4.75 V to 5.5 V and having 56 kΩ, 22 kΩ, or may include a pull-up resistor having one end connected to a positive supply voltage of 3.3 V and having 36 kΩ, 12 kΩ, or 4.7 kΩ. In some example embodiments, the first pull-up circuit 321 may provide a plurality of terminations among a plurality of source CC terminations Rp described above, and one of the plurality of terminations may be selected according to the first pull-up control signal C_PU1. As described below, the port controller 330 may use the first pull-up circuit 321 for providing a source CC termination of the CC1 pin A5 to measure the impedance between the CC1 pin A5 and the ground pin A12 (or the first CC impedance).

In order to measure the impedance between the CC1 pin A5 and the ground pin A12, the port controller 330 may control the first switch 322 through the first switch control signal C_SW1 such that the first switch 322 may connect the first pull-up circuit 321 and the CC1 pin A5. For example, the port controller 330 may control the first switch 322 to connect the first pull-up circuit 321 and the CC1 pin A5 for a certain (or alternatively, predetermined) period, and may measure the impedance between the CC1 pin A5 and the ground pin A12. Similarly, the impedance (or the second CC impedance) between the CC2 pin B5 and the ground pin A12 may be measured, and the port controller 330 may generate an activated detection signal DET when at least one of the first and second CC impedances indicates the existence of a foreign material. In some example embodiments, the port controller 330 may support a dual role port (DRP) capable of switching between a source (or host) and a sink (or device), and may detect the CC impedance (e.g., the first and second CC impedances) at a toggling period from a sink state to a source state (e.g., 10 to 20 times per second).

Referring to FIG. 7B, one end of the cable 500 may be connected to the USB receptacle 310 of the USB device 300, and the counterpart USB device 600 may be connected to the other end of the cable 500. That is, the USB device 300 may perform USB communication with the counterpart USB device 600 through the cable 500, and FIG. 7B illustrates that the USB device 300 functions as a source (or host) and the counterpart USB device 600 functions as a sink (or device). That is, as illustrated in FIG. 7B, the CC1 pin A5 of the USB device 300 may be connected to the pull-up circuit 321 and the CC2 pin B5 may be connected to a VCONN voltage (V_CONN) node, while a sink CC termination Rd may be formed at the CC1 pin A5 and the CC2 pin B5 of the counterpart USB device 600.

The cable 500 may electrically connect one of the CC1 pin A5 and the CC2 pin B5 included in the USB receptacle 310 of the USB device 300 to the CC1 pin A5 or the CC2 pin B5 included in the USB receptacle 610 of the counterpart USB device 600, while a power cable termination Ra may be provided to the CC1 pin A5 or the CC2 pin B5 of the USB receptacles 310 and 610 that are not electrically interconnected. That is, the USB receptacles 310 and 610 may be connected as illustrated in FIG. 7B. Unlike FIG. 7B, a power cable termination Ra may be provided to the CC1 pin A5 of the USB receptacle 310, and the CC2 pin B5 may be electrically connected to the CC1 pin A5 or CC2 pin B5 of the counterpart USB device 600. As such, the CC1 pin A5 and the CC2 pin B5 of the USB receptacle 310 may be connected to the ground with a resistor of about 1 kΩ as a power cable termination Ra. Thus, when the power cable termination Ra is detected at the CC1 pin A5 or the CC2 pin B5, the port controller 330 may determine that it is in a normal state. That is, the port controller 330 may generate a deactivated detection signal DET.

Referring to FIG. 7C, a foreign material may be introduced into the USB receptacle 310, and thus an impedance Z_CC1 may occur between the CC1 pin A5 and the ground pin A12 and an impedance Z_CC2 may occur between the CC2 pin B5 and the ground pin A12. Accordingly, as illustrated in FIG. 7C, when the CC1 pin A5 is connected to the first pull-up circuit 321 by the first switch 322 according to the first switch control signal C_SW1, the first input voltage VIN1 may have a level dropped by the impedance Z_CC1. Similarly, when the CC2 pin B5 is connected to the second pull-up circuit 323 by the second switch 324 according to the second switch control signal C_SW2, the second input voltage VIN2 may have a level dropped by the impedance Z_CC2.

In some example embodiments, the port controller 330 may adjust the driving strength of the first pull-up circuit 321 through the first pull-up control signal C_PU1. For example, the first pull-up circuit 321 may include a current source capable of generating one of 80 μA, 180 μA, and 330 μA according to the first pull-up control signal C_PU1. Thus, the port controller 330 may control the first pull-up circuit 321 to generate a current of a certain magnitude (e.g., 330 μA) upon detection of the impedance Z_CC1, and may generate the first pull-up control signal C_PU1 such that a relatively large current may be gradually generated from a relatively small current as described above with reference to FIG. 4B. Further, as described above with reference to FIGS. 3A and 3B, the driving strength of the first pull-up circuit 321 may be determined based on the resolution of the port controller 330 with respect to the first input voltage VIN1.

FIGS. 8A and 8B illustrate examples of equivalent circuits of the termination circuit 320 of FIG. 7A according to some example embodiments. In detail, FIG. 8A illustrates a termination circuit 320a including a pull-up resistor VR_PU, and FIG. 8B illustrates a termination circuit 320b including a first current source CS1. As described above with reference to FIGS. 7A to 7C, the termination circuits 320a and 320b and port controllers 330a and 330b of FIGS. 8A and 8B may detect impedances Z8a and Z8b between the CC1 pin A5 and the ground potential, respectively. In FIGS. 8A and 8B, it is assumed that the termination circuits 320a and 320b are set such that the voltage of the CC1 pin A5 (e.g., the first input voltage VIN1) is input to the port controllers 330a or 330b in order to detect the impedances Z8a or Z8b. Hereinafter, the contents described with reference to FIGS. 8A and 8B may also be applied to the detection of the impedance between the CC2 pin B5 and the ground potential, and redundant descriptions among the descriptions about FIGS. 8A and 8B will be omitted for conciseness.

Referring to FIG. 8A, the termination circuit 320a may be connected to the CC1 pin A5, may provide a first input voltage VIN1 to the port controller 330a, and may include a resistor sub-circuit 321a that receives a first pull-up control signal C_PU1 from the port controller 330a. The resistor sub-circuit 321a may function as the first pull-up circuit 321 of FIG. 7A and may provide a variable pull-up resistor VR_PU having one end connected to a positive supply voltage of 5 V. That is, the resistor sub-circuit 321a may change the resistance of the pull-up resistor VR_PU according to the first pull-up control signal C_PU1, and for example, the resistance of the pull-up resistor VR_PU may be switched between 56 kΩ, 22 kΩ, and 10 kΩ. The port controller 330a may gradually change or may set the pull-up resistor VR_PU to the lowest resistance while detecting the impedance Z8a.

The first input voltage VIN1 may have a level divided from 5 V by the pull-up resistor VR_PU and the impedance Z8a. When a foreign material is not introduced into the USB receptacle and thus the impedance Z8a is relatively high, the first input voltage VIN1 has approximately the same level as 5 V, and when a conductive foreign material is introduced into the USB receptacle and thus the impedance Z8a is relatively low, the first input voltage VIN1 may have a level lower than 5 V.

Referring to FIG. 8B, the termination circuit 320b may be connected to the CC1 pin A5, may provide a first input voltage VIN1 to the port controller 330b, and may include a first current source CS1 that receives a first pull-up control signal C_PU1 from the port controller 330b. The first current source CS1 may function as the first pull-up circuit 321 of FIG. 7A and may generate a variable current I_CC. The first current source CS1 may change the magnitude of the current I_CC according to the first pull-up control signal C_PU1. For example, the current I_CC may be switched between 80 μA, 180 μA, and 330 μA. The port controller 330b may set the maximum value of the current I_CC during the detection of the impedance Z8b or may gradually change the same.

Figure 9:
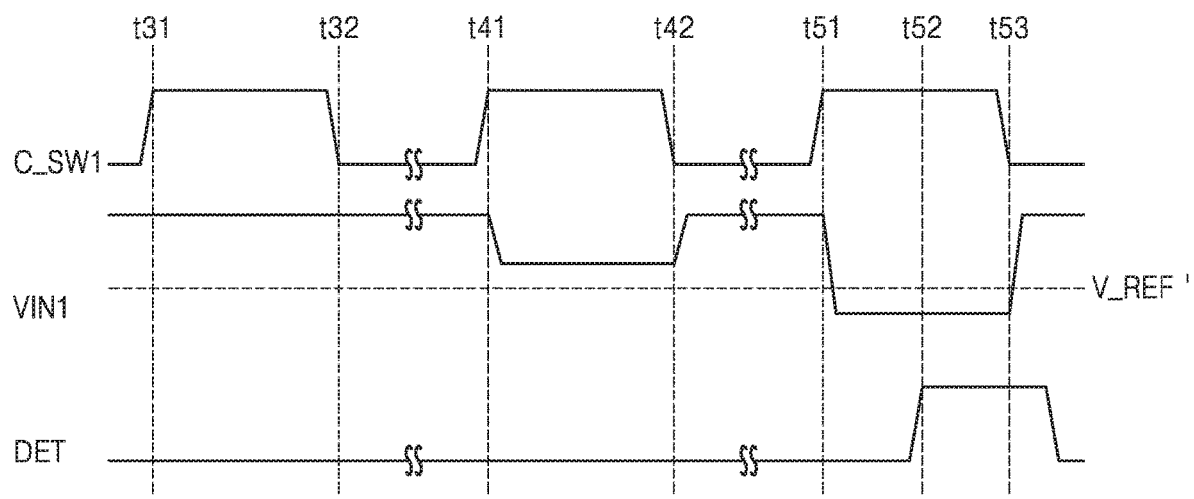
FIG. 9 is a timing diagram illustrating operations of a termination circuit and a port controller of FIG. 7A to 7C according to an example embodiment.

FIG. 9 is a timing diagram illustrating operations of the termination circuit 320 and the port controller 330 of FIG. 7A to 7C according to an example embodiment. In detail, FIG. 9 illustrates a first switch control signal C_SW1 for controlling the first switch 322 of FIG. 7A, a first input voltage VIN1 provided from the termination circuit 320, and a detection signal (DET) generated by the port controller 330, with the passage of time. As in FIG. 5, the first switch control signal C_SW1 and the detection signal DET may be active high signals. Further, in FIG. 9, it is assumed that the USB receptacle is in an open state at times t31 to t32, the cable 500 of FIG. 7B is connected at times t41 to t42, and a conductive foreign material is introduced at times t51 to t53. Hereinafter, FIG. 9 will be described with reference to FIGS. 7A to 7C.

At time t31, the port controller 330 may activate the first switch control signal C_SW1. Accordingly, the first switch 322 may electrically connect the pull-up circuit 321 to the CC1 pin A5. Because the USB receptacle is in an open state, the first input voltage VIN1 may be substantially maintained. The port controller 330 may measure the first input voltage VIN1 after time t31 and may recognize that a foreign material is not introduced into the USB receptacle due to the first input voltage VIN1 being higher than a reference voltage V_REF'. Thus, the detection signal DET may be maintained in an inactive state. At time t32, the port controller 330 may deactivate the first switch control signal C_SW1 and complete the detection of the impedance.

After a certain period has elapsed from time t31, at time t41, the port controller 330 may again activate the first switch control signal C_SW1. Because the cable 500 is connected to the USB receptacle 310, the power cable termination Ra may be formed at the CC1 pin A5 and thus the first input voltage VIN1 may drop as illustrated in FIG. 9. However, because the first input voltage VIN1 is higher than the reference voltage V_REF', the port controller 330 may recognize that a foreign material is not introduced into the USB receptacle 310. At time t42, the port controller 330 may deactivate the first switch control signal C_SW1 and complete the detection of the impedance.

After a certain period has elapsed from time t41, at time t51, the port controller 330 may again activate the first switch control signal C_SW1. Because a foreign material is introduced into the USB receptacle 310, a low impedance may be formed between the CC1 pin A5 and the ground potential and thus the first input voltage VIN1 may drop as illustrated in FIG. 9. Because the first input voltage VIN1 is lower than the reference voltage V_REF', the port controller 330 may recognize that a foreign material is introduced into the USB receptacle 310, and may activate the detection signal DET at time t52. At time t53, the port controller 330 may deactivate the first switch control signal C_SW1 and complete the detection of the impedance.

Figure 10:
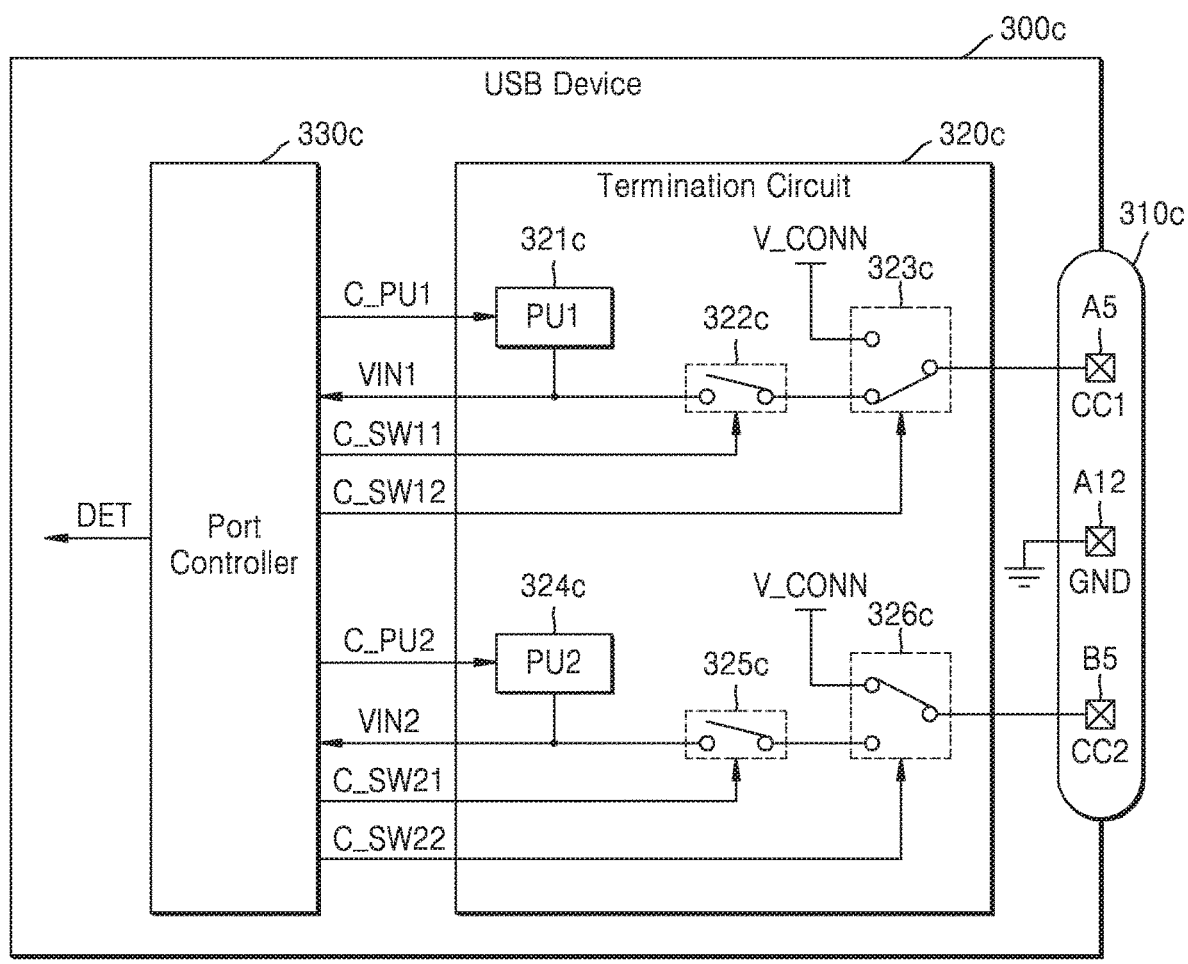
FIG. 10 is a block diagram illustrating a USB device according to an example embodiment.

FIG. 10 is a block diagram illustrating a USB device 300c according to an example embodiment. As illustrated in FIG. 10, the USB device 300c may include a USB receptacle 310c, a termination circuit 320c, and a port controller 330c.

The termination circuit 320c may provide first and second input voltages VIN1 and VIN2 to the port controller 330c, and the port controller 330c may provide first and second pull-up control signals C_PU1 and C_PU2 and switch control signals C_SW11, C_SW12, C_SW21, and C_SW22 to the termination circuit 320c. The termination circuit 320c may include first and second pull-up circuits 321c and 324c, first and second switches 322c and 325c, and VCONN switches 323c and 326c, and the port controller 330c may block the VCONN voltage V_CONN from being output through the CC1 pin A5.

When the port controller 330c recognizes that a foreign material is introduced into the USB receptacle 310c based on a level of the first input voltage VIN1 (that is, when the activated detection signal DET is generated), the port controller 330c may block the VCONN voltage V_CONN from being transmitted to the CC1 pin A5 and the CC2 pin B5 through the switch control signals C_SW12 and C_SW22 for controlling the VCONN switches 323c and 326c.

Accordingly, the leakage current between the VCONN voltage V_CONN and the ground potential may be mitigated or interrupted.

Figure 11:
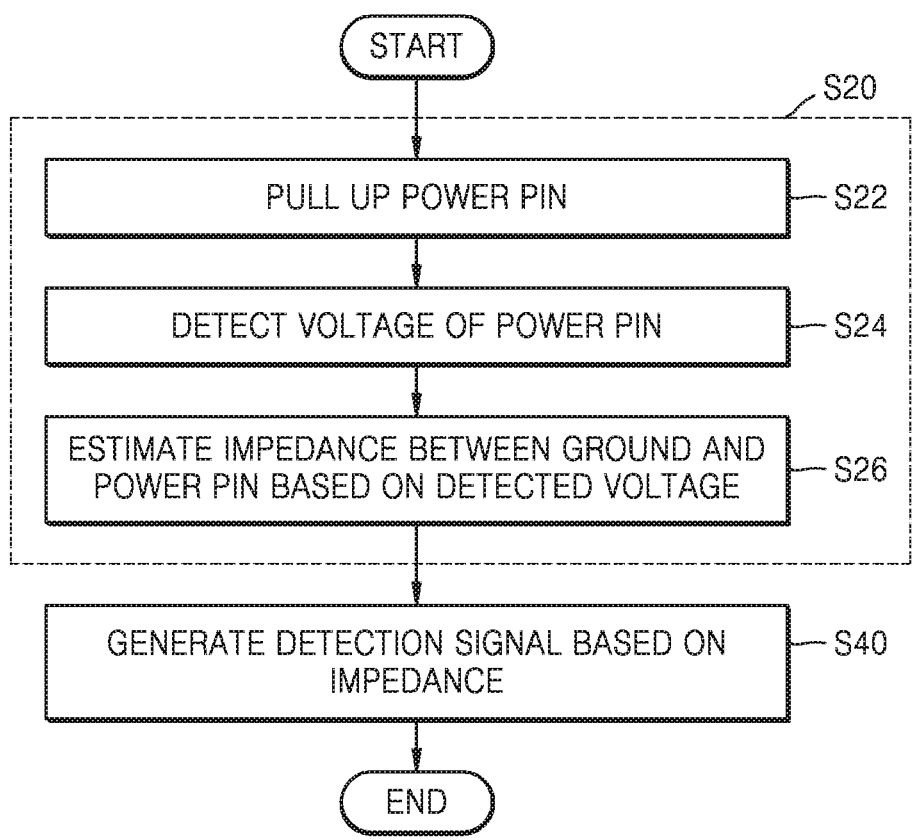
FIG. 11 is a flowchart illustrating a method of detecting a leakage current generation condition in a USB interface according to an example embodiment.

FIG. 11 is a flowchart illustrating a method of detecting a leakage current generation condition in a USB interface according to an example embodiment. For example, FIG. 11 may be performed by the termination circuit 120 and the port controller 130 of FIG. 1. Hereinafter, FIG. 11 will be described with reference to FIG. 1.

Referring to FIG. 11, in operation S20, an impedance between the ground pin and at least one power pin may be detected. The power pin may include, for example, the VBUS pins A4, A9, B4, and B9, the CC1 pin A5, and the CC2 pin B5 of FIG. 2, which transmit a positive supply voltage. As illustrated in FIG. 11, operation S20 may include a plurality of operations S22, S24, and S26.

In operation S22, the power pin may be pulled up. For example, the port controller 130 may pull up the power pin by controlling the pull-up circuit 121 of the termination circuit 120. In operation S24, the voltage of the power pin may be detected. For example, the port controller 130 may directly receive the voltage of the power pin, or may indirectly receive the voltage of the power pin by receiving a voltage proportional to the voltage of the power pin. The port controller 130 may detect the voltage of the power pin through an analog-to-digital converter and/or a comparator. Thereafter, in operation S26, the impedance between the ground and the power pin may be estimated based on the detected voltage. For example, when the voltage detected in operation S24 is lower than a reference voltage, the port controller 130 may estimate a relatively low impedance, and when it is not lower than the reference voltage, the port controller 130 may estimate a relatively high impedance.

In operation S40, a detection signal DET may be generated based on the impedance. For example, the port controller 130 may generate a deactivated detection signal DET according to the relatively low impedance, and may generate an activated detection signal DET according to the relatively high impedance.

Figure 12A:
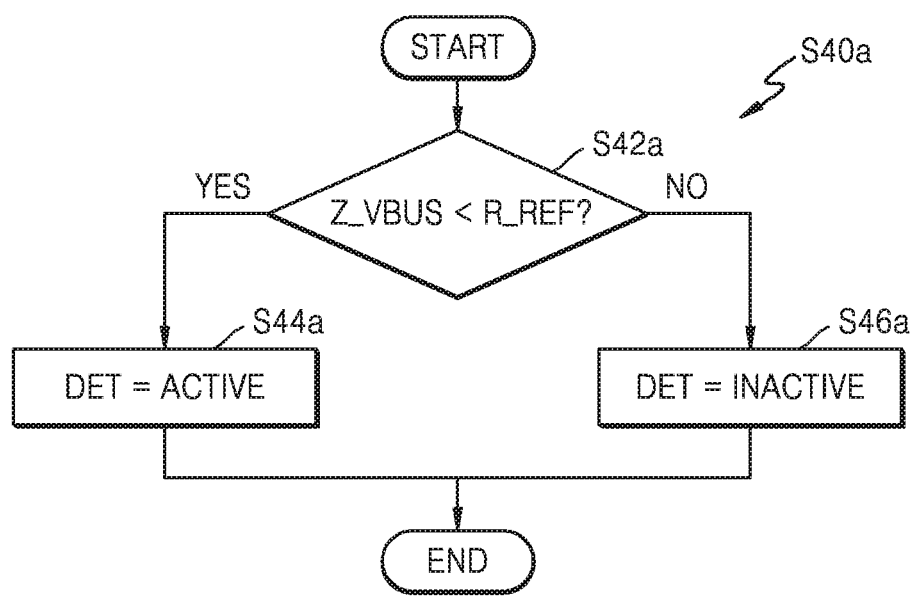
FIGS. 12A and 12B are flowcharts illustrating examples of operation S40 of FIG. 11 according to some example embodiments.
Figure 12B:
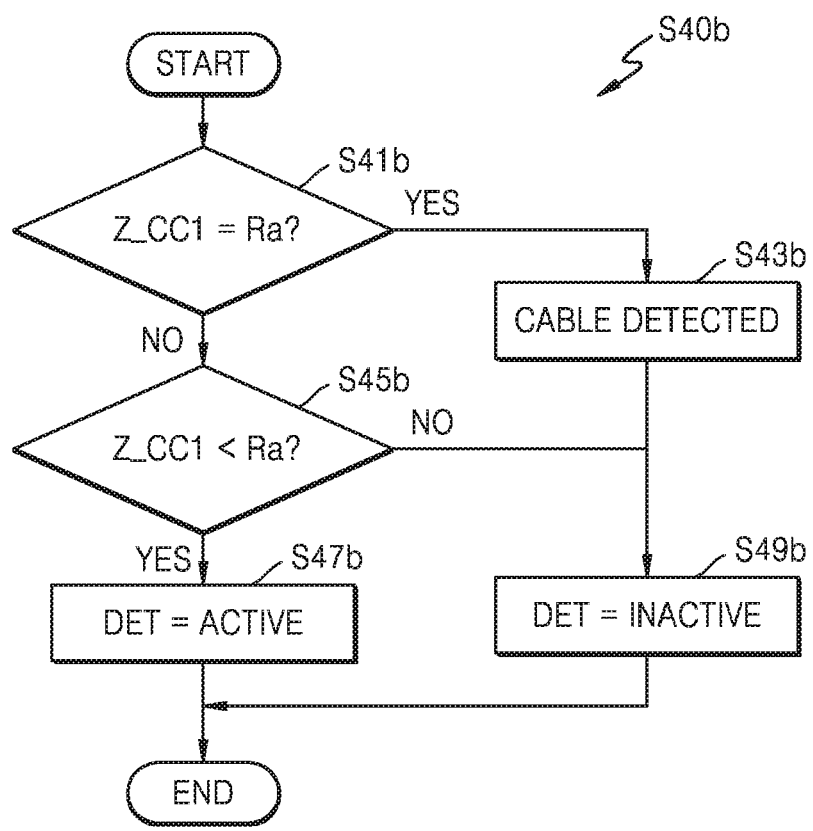

FIGS. 12A and 12B are flowcharts illustrating examples of operation S40 of FIG. 11 according to some example embodiments. In detail, FIG. 12A illustrates an operation of checking the VBUS pin A9 as a power pin, and FIG. 12B illustrates an operation of checking a CC pin (e.g., the CC1 pin A5 or the CC2 pin B5) as a power pin. As described above with reference to FIG. 11, in operations S40a and S40b of FIGS. 12A and 12B, a detection signal DET may be generated based on the detected impedance between the power pin and the ground potential.

Referring to FIG. 12A, in operation S42a, the VBUS impedance Z_VBUS between the VBUS pin A9 and the ground potential may be compared with a reference resistance R_REF. The reference resistance R_REF may be determined based on the impedance range of a foreign material that may be introduced into the USB receptacle, and for example, the reference resistance R_REF may be higher than the impedance range of the foreign material. Accordingly, when the detected VBUS impedance Z_VBUS is lower than the reference resistance R_REF, the detection signal DET may be activated to indicate the introduction of the foreign material in operation S44A, and when it is not lower than the reference resistance R_REF, the detection signal DET may be deactivated in operation S46A.

Referring to FIG. 12B, in operation S41b, the first CC impedance Z_CC1 between the CC1 pin A5 and the ground potential may be compared with a power cable termination (Ra) resistance. For example, because the power cable termination (Ra) resistance is defined as 900Ω to 1.2 kΩ according to the USB requirements, it may be determined whether the first CC impedance Z_CC1 is in the range of 900Ω to 1.2 kΩ When the first CC impedance Z_CC1 is equal to the power cable termination (Ra) resistance (e.g., when the first CC impedance Z_CC1 is in the range of 900Ω to 1.2 kΩ), the cable may be detected in operation S43b and then the detection signal DET may be deactivated in operation S49b.

When the first CC impedance Z_CC1 is not equal to the power cable termination (Ra) resistance (e.g., when the first CC impedance Z_CC1 is out of the range of 900Ω to 1.2 kΩ), it may be determined in operation S45b whether the first CC impedance Z_CC1 is lower than the power cable termination (Ra) resistance. For example, the first CC impedance Z_CC1 may be compared with the minimum value (e.g., 900Ω) of the power cable termination (Ra) resistance according to the USB requirements. When the first CC impedance Z_CC1 is lower than the power cable termination (Ra) resistance, the detection signal DET may be activated to indicate the introduction of the foreign material in operation S47b, and when it is not lower than the power cable termination (Ra) resistance, the detection signal DET may be deactivated in operation S49b.

Figure 13:
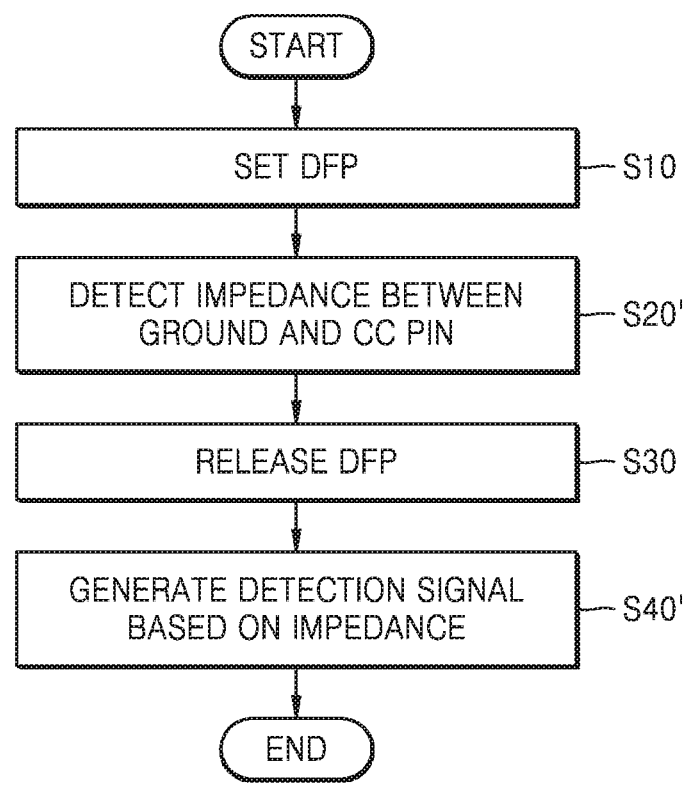
FIG. 13 is a flowchart illustrating a method of detecting a leakage current generation condition in a USB interface according to an example embodiment.

FIG. 13 is a flowchart illustrating a method of detecting a leakage current generation condition in a USB interface according to an example embodiment. In detail, FIG. 13 illustrates a method of using the impedance between the CC pin (e.g., the CC1 pin A5 or the CC2 pin B5) and the ground potential. In comparison with the example of FIG. 11, the impedance detection in the method of FIG. 13 may be performed in a state where a download faced port (DFP) is set.

Referring to FIG. 13, a DFP may be set in operation S10. For example, when a USB device (e.g., 100 in FIG. 1) supports a dual role port (DRP) capable of switching between a source (or host) and a sink (or device), the USB device may be set to a DFP or an upload faced port (UFP). When the USB device is set to the DFP, the CC pins (e.g., the CC1 pin A5 and the CC2 pin B5) may be pulled up, and when the USB device is set to the UFP, the sink CC termination Rd may be connected. For example, in the DFP, a current of 80 μA, 180 μA, or 330 μA may be supplied to the CC1 pin A5 and the CC2 pin B5 or a pull-up resistor of 56 kΩ, 22 kΩ, or 10 kΩ may be connected, and in the UFP, a pull-down resistor of 5.1 kΩ may be connected to the CC1 pin A5 and the CC2 pin B5. Accordingly, the CC1 pin A5 and the CC2 pin B5 may be pulled up by setting the DFP in operation S10.

In operation S20', the impedance between the ground and the CC pin may be detected. Because the CC pin is pulled up in operation S10, the voltage of the CC pin may be changed according to the impedance with respect to the ground, and the impedance between the ground and the CC pin may be detected by measuring the voltage of the CC pin (or a voltage proportional to the voltage of the CC pin). In operation S30, the DFP may be released. Because the detection of the impedance is completed in operation S20', the DFP may be released and thus the pull-up connected to the CC pins (e.g., the CC1 pin A5 and the CC2 pin B5) may be released. Thereafter, in operation S40', a detection signal may be generated based on the detected impedance.

Figure 14:
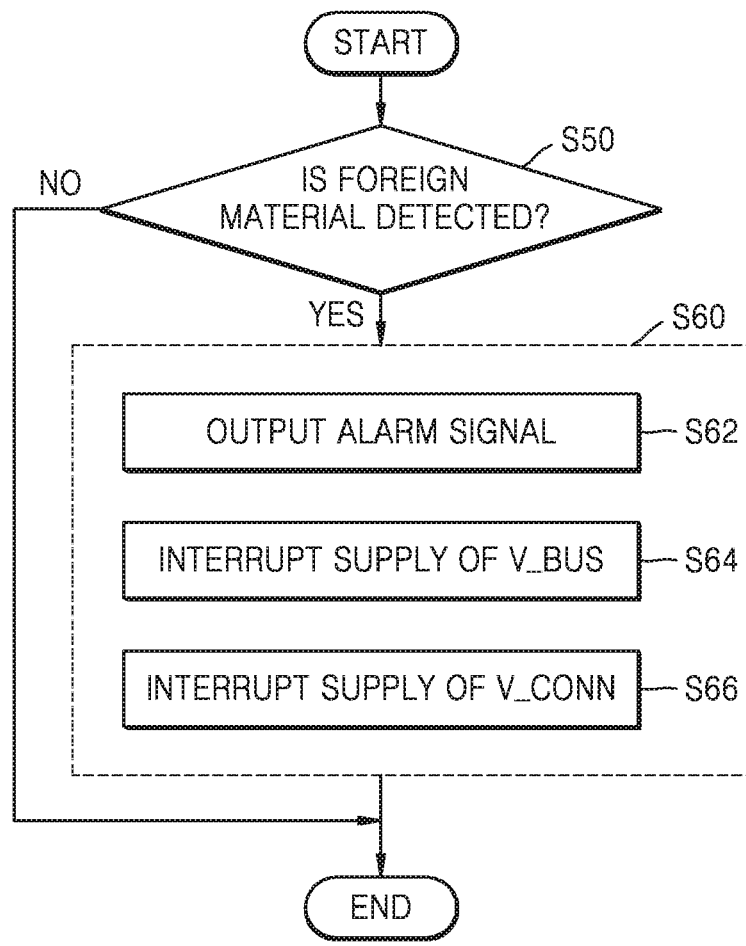
FIG. 14 is a flowchart illustrating a method of detecting a leakage current generation condition in a USB interface according to an example embodiment.

FIG. 14 is a flowchart illustrating a method of detecting a leakage current generation condition in a USB interface according to an example embodiment. In detail, FIG. 14 illustrates subsequent operations according to the detection signal DET indicating the introduction of a foreign material (e.g., according to the activated detection signal DET). For example, FIG. 14 may be performed by the USB device 100 of FIG. 1, and hereinafter, FIG. 14 will be described with reference to FIG. 1.

In operation S50, it may be checked whether a foreign material is detected. For example, the main controller 150 may check whether a foreign material is detected according to the detection signal DET provided from the port controller 130. When the detection signal DET is activated (e.g., when the foreign material is detected), operation S60 may be performed subsequently.

In operation S60, a desired operation may be performed according to the detection of the foreign material. As illustrated in FIG. 14, operation S60 may include a plurality of operations S62, S64, and S66, and at least one of the plurality of operations S62, S64, and S66 may be performed.

In operation S62, an alarm signal may be output. For example, the main controller 150 may cause the signal generator 160 to generate an alarm signal S_ALA by providing an alarm control signal CTRL to the signal generator 160. As described above with reference to FIG. 1, the alarm signal S_ALA may include a signal recognizable by the user of the USB device 100, such as a visual signal, an auditory signal, or a vibration.

In operation S64, the supply of a VBUS voltage V_BUS may be interrupted. For example, the power circuit 140 of the USB device 100 may interrupt the VBUS voltage V_BUS from being provided to the USB receptacle 110 according to the activated detection signal DET. Accordingly, a leakage current flowing through the VBUS pin A9 by the foreign material may be interrupted.

In operation S66, the supply of a VCONN voltage V_CONN may be interrupted. In some example embodiments, the port controller 130 may control the termination circuit 120 according to the activated detection signal DET to block the VCONN voltage V_CONN provided from the power circuit 140 from being transmitted to the USB receptacle 110. In some example embodiments, the power circuit 140 may interrupt the VCONN voltage V_CONN from being provided to the termination circuit 120 according to the activated detection signal DET. Accordingly, a leakage current flowing through the CC pin (e.g., the CC1 pin A5 or the CC2 pin B5) by the foreign material may be interrupted.

Some example embodiments of the inventive concepts have been described above with reference to the drawings. Although particular terms are used herein to describe the example embodiments, they are merely used to describe the technical idea of the inventive concepts and are not intended to limit the scope of the inventive concepts as described in the following claims. Therefore, those of ordinary skill in the art will understand that various modifications and other equivalent example embodiments may be derived therefrom. Thus, the spirit and scope of the inventive concepts should be defined by the appended claims.

While the inventive concepts have been particularly shown and described with reference to some example embodiments thereof, it will be understood that various changes in form and details may be made therein without departing from the spirit and scope of the following claims.

What is claimed is:

1. A device for detecting a leakage current generation condition in a universal serial bus (USB) interface, the device comprising:
   at least one pull-up circuit connected to at least one power pin; and
   a port controller configured to detect at least one impedance between a ground pin and the at least one power pin, detect a leakage current generation condition in the at least one power pin based on the at least one impedance detected, and activate a detection signal in response to the leakage current generation condition being detected, the port controller configured to detect the at least one impedance by controlling the at least one pull-up circuit to pull up the at least one power pin and detecting a voltage of the at least one power pin, wherein the pull-up circuit comprises a channel configuration (CC) pull-up circuit connected to at least one CC pin, the port controller is configured to detect a CC impedance between the ground pin and the at least one CC pin by controlling the CC pull-up circuit to pull up the at least one CC pin and detecting a voltage of the at least one CC pin, the CC pull-up circuit comprises a CC current source configured to supply source CC termination (Rp) currents to the at least one CC pin, and the port controller is further configured to control the CC current source to supply one of the source CC termination (Rp) currents to the at least one CC pin to detect the CC impedance.

2. The device of claim 1, wherein the at least one power pin comprises at least one of a CC1 pin for communicating a first channel configuration signal, a CC2 pin for communicating a second channel configuration signal, and a VBUS pin for receiving a cable bus power.

3. The device of claim 1, wherein the port controller is further configured to activate the detection signal in response to the CC impedance being less than a power cable termination (Ra) resistance.

4. The device of claim 1, wherein the port controller is further configured to control the CC current source to supply the largest one of the source CC termination (Rp) currents to the at least one CC pin to detect the CC impedance.

5. The device of claim 1, wherein the port controller is further configured to detect each of a first CC impedance between a CC1 pin and the ground pin and a second CC impedance between a CC2 pin and the ground pin, and generate the detection signal based on the first and second CC impedances.

6. The device of claim 1, further comprising:
a VCONN switch configured to supply or interrupt a VCONN voltage to the at least one CC pin,
wherein the port controller is further configured to control the VCONN switch to interrupt supply of the VCONN voltage to the at least one CC pin in response to the detection signal activated.

7. The device of claim 1, wherein the port controller is further configured to support a dual role port (DRP) capable of switching between a source and a sink and set a download faced port (DFP) before detecting the CC impedance.

8. The device of claim 1, wherein
the pull-up circuit comprises a VBUS pull-up circuit and a VBUS detection switch connected between the VBUS pull-up circuit and a VBUS pin, and
the port controller is further configured to detect a VBUS impedance between the ground pin and the VBUS pin by turning on the VBUS detection switch and detecting a voltage of a node between the pull-up circuit and the VBUS detection switch.

9. The device of claim 8, wherein the VBUS pull-up circuit comprises a current source and the pull-up circuit further comprises a resistor connected between the current source and the VBUS detection switch.

10. The device of claim 8, further comprising:
a VBUS switch configured to supply or interrupt a VBUS voltage to the VBUS pin,
wherein the port controller is further configured to control the VBUS switch to interrupt supply of the VBUS voltage to the VBUS pin in response to the detection signal activated.

11. The device of claim 1, wherein the port controller is further configured to detect the impedance in a state where a connected counterpart USB entity is not detected.

12. The device of claim 1, further comprising:
a main controller configured to output an alarm control signal in response to the detection signal activated, the alarm control signal being a signal recognizable by a user of the device.

13. The device of claim 1, wherein the port controller is further configured to detect the impedance according to a period.

14. The device of claim 13, wherein the port controller is further configured to support a dual role port (DRP) capable of switching between a source and a sink, and detect the impedance according to a toggling period from a sink state to a source state.

15. A device comprising:
a universal serial bus (USB) receptacle comprising a ground pin and at least one channel configuration (CC) pin;
a CC pull-up circuit connected to the at least one CC pin; and
a port controller configured to detect a CC impedance between the ground pin and the at least one CC pin by controlling the CC pull-up circuit to pull up the at least one CC pin, and activate a detection signal in response to a leakage current generation condition being detected in the USB receptacle based on the CC impedance detected,
wherein the CC pull-up circuit comprises a resistor sub-circuit configured to electrically connect source CC termination (Rp) pull-up resistors to the at least one CC pin, and
the port controller is further configured to control the resistor sub-circuit to detect the CC impedance such that one of the source CC termination (Rp) pull-up resistors is electrically connected to the at least one CC pin.

16. The device of claim 15, wherein the port controller is further configured to control the resistor sub-circuit to detect the CC impedance such that a pull-up resistor having the smallest resistance among the source CC termination (Rp) pull-up resistors is electrically connected to the at least one CC pin.

* * * * *